(12) United States Patent
Shimizu et al.

(10) Patent No.: US 11,703,452 B2
(45) Date of Patent: Jul. 18, 2023

(54) METHOD AND APPARATUS FOR MEASURING TRANSMITTANCE OF QUARTZ CRUCIBLE

(71) Applicant: SUMCO CORPORATION, Tokyo (JP)

(72) Inventors: Yasunobu Shimizu, Tokyo (JP); Keiichi Takanashi, Tokyo (JP); Takeshi Fujita, Akita (JP); Eriko Kitahara, Akita (JP); Masanori Fukui, Akita (JP)

(73) Assignee: SUMCO CORPORATION, Tokyo (JP)

( * ) Notice: Subject to any disclaimer, the term of this patent is extended or adjusted under 35 U.S.C. 154(b) by 68 days.

(21) Appl. No.: 17/055,314

(22) PCT Filed: May 15, 2019

(86) PCT No.: PCT/JP2019/019357
§ 371 (c)(1),
(2) Date: Nov. 13, 2020

(87) PCT Pub. No.: WO2019/221191
PCT Pub. Date: Nov. 21, 2019

(65) Prior Publication Data
US 2021/0181106 A1    Jun. 17, 2021

(30) Foreign Application Priority Data

May 17, 2018 (JP) ................. 2018-095299

(51) Int. Cl.
*G01N 21/59* (2006.01)
*C30B 15/10* (2006.01)
(Continued)

(52) U.S. Cl.
CPC ............. *G01N 21/59* (2013.01); *C30B 15/10* (2013.01); *C30B 29/06* (2013.01); *C30B 35/002* (2013.01); *G01B 11/24* (2013.01); *G01N 21/49* (2013.01)

(58) Field of Classification Search
CPC ................. G01N 21/59; G01N 21/49; G01N 2021/4707; C30B 15/10; C30B 29/06; C30B 35/002; G01B 11/24
See application file for complete search history.

(56) References Cited

U.S. PATENT DOCUMENTS

2010/0089308 A1    4/2010 Kishi et al.
2010/0107970 A1*   5/2010 Kodama ................ C30B 15/10
                                                    117/208
(Continued)

FOREIGN PATENT DOCUMENTS

CN    102539390 A *  7/2012 ............. G01N 21/59
JP    9-157082 A     6/1997
(Continued)

OTHER PUBLICATIONS

Official Communication issued in International Bureau of WIPO Patent Application No. PCT/JP2019/019357, dated Jul. 23, 2019, along with an English translation thereof.
(Continued)

*Primary Examiner* — Tarifur R Chowdhury
*Assistant Examiner* — Roberto Fabian, Jr.
(74) *Attorney, Agent, or Firm* — Greenblum & Bernstein, P.L.C.

(57) ABSTRACT

A measurement method and a measurement apparatus are capable of measuring the transmittance of a quartz crucible accurately. A measurement method includes: emitting a parallel light from a light source disposed on a side of one wall surface of a quartz crucible toward a predetermined
(Continued)

measurement point of the quartz crucible; measuring reception levels of light transmitted through the quartz crucible at a plurality of positions by disposing a detector at the plurality of positions on a circle centered around an exit point of the parallel light on the other wall surface of the quartz crucible; and calculating a transmittance of the quartz crucible at the predetermined measurement point based on a plurality of the reception levels of the transmitted light measured at the plurality of positions.

22 Claims, 15 Drawing Sheets

(51) Int. Cl.
    *C30B 29/06*     (2006.01)
    *C30B 35/00*     (2006.01)
    *G01B 11/24*     (2006.01)
    *G01N 21/49*     (2006.01)

(56) References Cited

U.S. PATENT DOCUMENTS

| | | | |
|---|---|---|---|
| 2010/0126407 A1 | 5/2010 | Kishi et al. | |
| 2010/0251959 A1* | 10/2010 | Kodama | C30B 15/10 |
| | | | 117/208 |
| 2011/0025838 A1 | 2/2011 | Ninomiya | |
| 2014/0326172 A1 | 11/2014 | Sudo et al. | |
| 2015/0171173 A1 | 6/2015 | Umeda et al. | |
| 2016/0313234 A1 | 10/2016 | Sudo et al. | |
| 2020/0118286 A1 | 4/2020 | Shimizu et al. | |

FOREIGN PATENT DOCUMENTS

| | | | | | |
|---|---|---|---|---|---|
| JP | 9-210848 | A | | 8/1997 | |
| JP | 09210848 | A | * | 8/1997 | |
| JP | 11183149 | A | * | 7/1999 | ............ G01B 11/24 |
| JP | 2000-146533 | A | | 5/2000 | |
| JP | 2000146533 | A | * | 5/2000 | |
| JP | 2009-85795 | A | | 4/2009 | |
| JP | 2009-300165 | A | | 12/2009 | |
| JP | 2009300165 | A | * | 12/2009 | |
| JP | 2017-202974 | A | | 11/2017 | |
| KR | 10-2004-0005013 | A | | 1/2004 | |
| TW | 2017-38528 | A | | 11/2017 | |
| WO | WO-2005073699 | A1 | * | 8/2005 | ............ G01B 11/26 |
| WO | 2013/094318 | A1 | | 6/2013 | |
| WO | 2015/099001 | A1 | | 7/2015 | |
| WO | WO-2015099001 | A | * | 7/2015 | ............... C03C 3/04 |
| WO | 2017/158655 | A1 | | 9/2017 | |
| WO | 2017/158656 | A1 | | 9/2017 | |

OTHER PUBLICATIONS

Office Action issued in Republic of Korea Counterpart Patent Appl. No. 10-2022-7032761, dated Oct. 14, 2022, together with an English translation of the same.

* cited by examiner

METHOD AND APPARATUS FOR MEASURING TRANSMITTANCE OF QUARTZ CRUCIBLE

TECHNICAL FIELD

The present invention relates to a method and apparatus for measuring transmittance of a quartz crucible for pulling up a silicon single crystal.

BACKGROUND ART

A quartz crucible (silica glass crucible) has been used in manufacture of a silicon single crystal according to a Czochralski method (hereinafter referred to as "CZ method"). In the CZ method, a silicon raw material is packed into a quartz crucible and heated by radiant heat from a heater provided outside the quartz crucible to be melted. Then, a seed crystal is immersed in the silicon melt and is then gradually pulled up while the quartz crucible is rotated, whereby a large-diameter single crystal is grown at the lower end of the seed crystal. In order to manufacture a high-quality silicon single crystal for a semiconductor device at low cost, a single crystallinity per one pull-up process needs to be increased. To this end, a crucible capable of stably holding a silicon melt for a long period of time is required.

Patent Literature 1 describes a quartz crucible for obtaining a silicon single crystal having a high single crystallinity and having a large dissolution amount of oxygen. To this end, the infrared-ray transmittance of a randomly selected section including a sidewall section, a curved section, and a bottom section of a crucible is set to 30% to 80%, and the average infrared-ray transmittance of the curved section is set larger than those of the sidewall section and the bottom section.

Patent Literature 2 describes a strain measurement apparatus for measuring the strain distribution of a quartz crucible nondestructively. The strain measurement apparatus includes: a light source for lighting a quartz crucible from outside thereof; a camera disposed inside the quartz crucible; a first polarizing plate and a first ¼ wavelength plate disposed between the light source and a wall body of the quartz crucible; a second polarizing plate and a second ¼ wavelength plate disposed between the camera and the inner surface of the quartz crucible; and a camera control mechanism for controlling the photographing direction of the camera. The camera photographs the light which is projected from the light source and has passed sequentially through the first polarizing plate, the first ¼ wavelength plate, the wall body of the quartz crucible, the second ¼ wavelength plate, and the second polarizing plate to measure the residual strain distribution of the quartz crucible.

Further, although not relating to a measurement method for a quartz crucible, Patent Literature 3 describes a measurement method for the reflectivity or transmittance of an electromagnetic wave, suitably used in evaluation of reflection characteristics of a heat insulating material for an industrial furnace or an incinerator under high temperatures. In this measurement method, a high-temperature sample is irradiated with an electromagnetic wave, and the electromagnetic wave reflected by the sample or the electromagnetic wave transmitted through the sample is detected with an electromagnetic wave detection means being moved concentrically around the sample. With this method, it is possible to measure the true reflectivity or true transmittance of a high-temperature body itself relative to an electromagnetic wave without the use of a standard sample.

RELATED ART

Patent Literature

[Patent Literature 1] Japanese Patent Application Laid-open No. H09-157082
[Patent Literature 2] Japanese Patent Application Laid-open No. 2017-202974
[Patent Literature 3] Japanese Patent Application Laid-open No. 2009-85795

SUMMARY OF THE INVENTION

Problem to be Solved by the Invention

During pull-up of a silicon single crystal, the inner surface of a quartz crucible contacts a silicon melt to be gradually eroded, so that a silicon single crystal manufactured by the CZ method contains oxygen supplied from the crucible. The oxygen in the silicon single crystal not only serves as a gettering site for contaminant metals but also plays a role of enhancing mechanical strength by immobilizing dislocations. However, excessively high concentration of oxygen may not only affect device characteristics but also reduce mechanical strength. In recent years, owing to improvement in manufacturing technology, enhancement of device characteristics is valued more than a gettering effect, and a silicon single crystal having a low interstitial oxygen concentration is being sought.

It is necessary to suppress heating temperature of a crucible in order to manufacture a silicon single crystal with a low oxygen concentration, and this involves adjustment of the transmittance of the crucible. However, excessively low heating temperature lowers the temperature of a silicon melt to make crystal pull-up control difficult, thus deteriorating a single crystallinity. Thus, it is necessary to precisely control the transmittance of a quartz crucible on a region-by-region basis. The term "transmittance" mentioned herein refers to the percentage of optical power of a certain wavelength that is transmitted to the inside of a quartz crucible to the entire optical power entering from outside of the wall surface of the quartz crucible.

As illustrated in FIG. 15, in a conventional transmittance measurement method, a power meter 62 (detector) is disposed opposite to an infrared lamp 61 so as to be spaced apart from the infrared lamp 61 at a predetermined distance, and a crucible piece 60 (quartz glass piece) cut from a quartz crucible is disposed between the infrared lamp 61 and the power meter 62 so as to closely contact the power meter 62. An infrared ray from the infrared lamp 61 is received by the power meter 62, whereby the intensity (reception level) of the infrared ray that has been transmitted through the crucible wall is measured.

However, the crucible wall made of quartz glass has a bubble layer (opaque layer) containing a large number of micro-bubbles, and thus the incident light scatters and spreads inside the crucible wall. Thus, in the conventional transmittance measurement method, the transmitted light leaks outside the light reception range of the detector, preventing correct measurement of the transmittance. Further, conventional measurement methods for the transmittance of a quartz crucible are destructive inspections that use a crucible piece of several 10 mm square cut out from a crucible product. That is, such methods can only assume that crucibles manufactured under the same conditions have the same transmittance and cannot nondestructively measure the true transmittance of a quartz crucible in a product state.

Patent Literature 3 merely describes a method of measuring the angular dependency of the transmittance/reflectivity of a sample and does not disclose a method of correctly measuring the transmittance based on a transmitted light scattering inside the sample. The conventional transmittance measurement method described in Patent Literature 3 does not use, as an object to be measured, a sample inside of which a transmitted light scatters and can comparatively easily detect the total light transmission through the sample. In addition, the method disclosed in Patent Literature 3 is a destructive inspection and has a significant difficulty in measuring a large-sized object like a quartz crucible on account of the restriction of geometric arrangement.

It is therefore an object of the present invention to provide a transmittance measurement method and apparatus capable of measuring the transmittance of a quartz crucible accurately.

Means for Solving the Problems

To solve the above problems, a method of measuring transmittance of a quartz crucible according to the present invention includes: emitting a parallel light from a light source disposed on a side of one wall surface of a quartz crucible toward a predetermined measurement point on the quartz crucible; measuring reception levels of light transmitted through the quartz crucible at a plurality of positions by disposing a detector at the plurality of positions on a circle centered around an exit point of the parallel light on other wall surface of the quartz crucible; and calculating a transmittance of the quartz crucible at the predetermined measurement point based on a plurality of the reception levels of the transmitted light measured at the plurality of positions.

According to the present invention, a transmitted light spread by scattering inside the crucible wall can be measured in a wide range, whereby it is possible to correctly measure the transmittance of the quartz crucible in a non-contact manner.

In the transmittance measurement method according to the present invention, a single detector is preferably turned along the circle to position the detector at the plurality of positions. In this case, a maximum turning angle of the detector with respect to a light axis of the parallel light is preferably 45° or more. Thus, it is possible to correctly measure the transmittance of the quartz crucible using a single light reception means. This further prevents measurement error of the transmittance due to the influence of a variation in output level among the light reception means that may occur when a plurality of light reception means are used.

In the transmittance measurement method according to the present invention, it is also preferable to use a plurality of detectors previously disposed at the plurality of positions is used so as to calculate the transmittance of the quartz crucible. This allows the transmittance to be measured simultaneously at a plurality of positions, thereby making it possible to improve throughput.

In the transmittance measurement method according to the present invention, it is preferable to dispose the light source outside the quartz crucible, to dispose the detector inside the quartz crucible, and to measure the transmittance of the quartz crucible in a nondestructive manner by receiving the parallel light emitted from the light source toward the quartz crucible using the detector. Thus, it is possible to correctly measure the transmittance of the quartz crucible itself.

In the transmittance measurement method according to the present invention, it is preferable to measure the transmittance at a plurality of measurement points different in position in the vertical direction of the quartz crucible by moving the positions of the light source and detector in the vertical direction along the wall surface of the quartz crucible. This allows the transmittance to be measured at the sidewall section, corner section, and bottom section of the quartz crucible.

In the transmittance measurement method according to the present invention, it is preferable to measure the transmittance at a plurality of measurement points different in position in the circumferential direction of the quartz crucible by relatively moving the positions of the light source and detector with respect to the quartz crucible in the circumferential direction along the wall surface of the quartz crucible. Thus, it is possible to measure the transmittance by disposing a light projection means and a light reception means at desired positions in the circumferential direction of the quartz crucible.

In the transmittance measurement method according to the present invention, it is preferable to calculate the average value of a plurality of transmittance values measured at a plurality of measurement points same in position in the vertical direction of the quartz crucible and different in position in the circumferential direction. Thus, it is possible to enhance measurement accuracy of the transmittance at any position in the vertical direction of the quartz crucible.

In the transmittance measurement method according to the present invention, it is preferable to directly receive the parallel light from the light source using a detector disposed on the circle and right in front of the light source to thereby calculate the blank value of the light reception level and then to calculate the transmittance from the ratio of the reception level of a transmitted light to the blank value. Thus, it is possible to calculate the transmittance of the quartz crucible.

In the present invention, the parallel light is preferably a laser beam output from a laser light source and having an expanded beam diameter. In this case, the expanded beam diameter of the laser beam is preferably 5 mm or more. According to the present invention, it is possible to detect a transmitted light in which the influences of a local variation in bubble distribution of the quartz crucible are averaged. Thus, it is possible to stably measure the transmittance at any measurement point on the quartz crucible and to reduce the time for measuring the transmittance of the quartz crucible.

In the present invention, the parallel light is preferably a laser line light converted from a laser beam output from a laser light source. In this case, the spot length of the laser line light is preferably 10 mm or more. According to the present invention, it is possible to detect a transmitted light in which the influences of a local variation in bubble distribution of the quartz crucible are averaged. Thus, it is possible to stably measure the transmittance at any measurement point on the quartz crucible and to reduce the time for measuring the transmittance of the quartz crucible.

A transmittance measurement apparatus for a quartz crucible according to the present invention includes: a light source disposed on a side of one wall surface of a quartz crucible and configured to emit a parallel light toward a predetermined measurement point on the quartz crucible; at least one detector disposed at the other wall surface side of the quartz crucible and configured to receive light transmitted through the quartz crucible; and a transmittance calculator configured to calculate the transmittance of the quartz crucible based on reception levels of the transmitted light measured by the detector. The detector measures the reception level of the light transmitted through the quartz crucible at a plurality of positions on a circle centered around an exit point of the parallel light on the other wall surface. The transmittance calculator calculates the transmittance of the quartz crucible at the predetermined measurement point based on a plurality of reception levels of the transmitted light measured at the plurality of positions.

According to the present invention, a transmitted light scattering inside the crucible wall to spread can be measured in a wide range, whereby it is possible to correctly measure the transmittance of the quartz crucible in a noncontact manner.

The transmittance measurement apparatus according to the present invention preferably further includes a turning mechanism for turning a single detector along the circle. In this case, a maximum turning angle of the detector with respect to a light axis of the parallel light is preferably 45° or more. Thus, it is possible to correctly measure the transmittance of the quartz crucible using a single light reception means.

The transmittance measurement apparatus according to the present invention preferably further includes a plurality of detectors disposed at the plurality of positions. This allows the transmittance to be measured simultaneously at a plurality of positions different in turning angle, thereby making it possible to improve throughput.

In the present invention, it is preferable that the light source is disposed outside the quartz crucible, that the detector is disposed inside the quartz crucible, and that the transmittance of the quartz crucible is measured in a non-destructive manner by receiving the parallel light emitted from the light source toward the quartz crucible using the detector. Thus, it is possible to correctly measure the transmittance of the quartz crucible itself.

The transmittance measurement apparatus according to the present invention preferably further includes: a light projection position changing means vertically moving the light source along the one wall surface of the quartz crucible; and a light reception position changing means vertically moving the detector along the other wall surface of the quartz crucible. This allows the transmittance to be measured at the sidewall section, corner section, and bottom section of the quartz crucible.

The transmittance measurement apparatus according to the present invention preferably further includes a crucible rotation mechanism rotating the quartz crucible. Thus, it is possible to measure the transmittance by disposing the light projection means and light reception means at desired positions in the circumferential direction of the quartz crucible.

The transmittance calculator preferably calculates the average value of a plurality of transmittance values measured at a plurality of measurement points same in position in the vertical direction of the quartz crucible and different in position in the circumferential direction. Thus, it is possible to enhance measurement accuracy of the transmittance at any position in the vertical direction of the quartz crucible.

The transmittance calculator preferably calculates the transmittance from the ratio of the light reception level of a transmitted light to the blank value of a light reception level previously calculated by directly receiving the parallel light from the light source using a detector disposed on the circle and right in front of the light source. Thus, it is possible to calculate the transmittance of the quartz crucible.

In the present invention, the light source preferably includes: a laser light source outputting a laser beam; and a beam expander expanding the beam diameter of the laser beam output from the laser light source. In this case, the expanded beam diameter of the laser beam is preferably 5 mm or more. With this configuration, it is possible to detect a transmitted light in which the influences of a local variation in bubble distribution of the quartz crucible are averaged. Thus, it is possible to stably measure the transmittance at any measurement point on the quartz crucible and to reduce the time for measuring the transmittance of the quartz crucible.

In the present invention, the light source preferably includes: a laser light source outputting a laser beam; and a line generator converting the laser beam output from the laser light source into a laser line light. In this case, the spot length of the laser line light is preferably 10 mm or more. With this configuration, it is possible to detect a transmitted light in which the influences of a local variation in bubble distribution of the quartz crucible are averaged. Thus, it is possible to stably measure the transmittance at any measurement point on the quartz crucible and to reduce the time for measuring the transmittance of the quartz crucible.

Effects of the Invention

According to the present invention, there can be provided a transmittance measurement method and apparatus capable of measuring the transmittance of a quartz crucible accurately.

BRIEF DESCRIPTION OF THE DRAWINGS

FIG. 3A is a photograph image of the laser beam transmitted through the quartz crucible, and FIG. 3B is a schematic view illustrating a spatial distribution of transmitted light intensity.

FIGS. 14A and 14B are graphs illustrating the luminance profile of the light transmitted through the quartz crucible, wherein FIG. 14A shows a case where the opaque layer is thin, and particularly FIG. 14B shows a case where the opaque layer is thick.

MODE FOR CARRYING OUT THE INVENTION

Hereinafter, preferred embodiments of the present invention will be described in detail with reference to the accompanying drawings.

Figure 1:
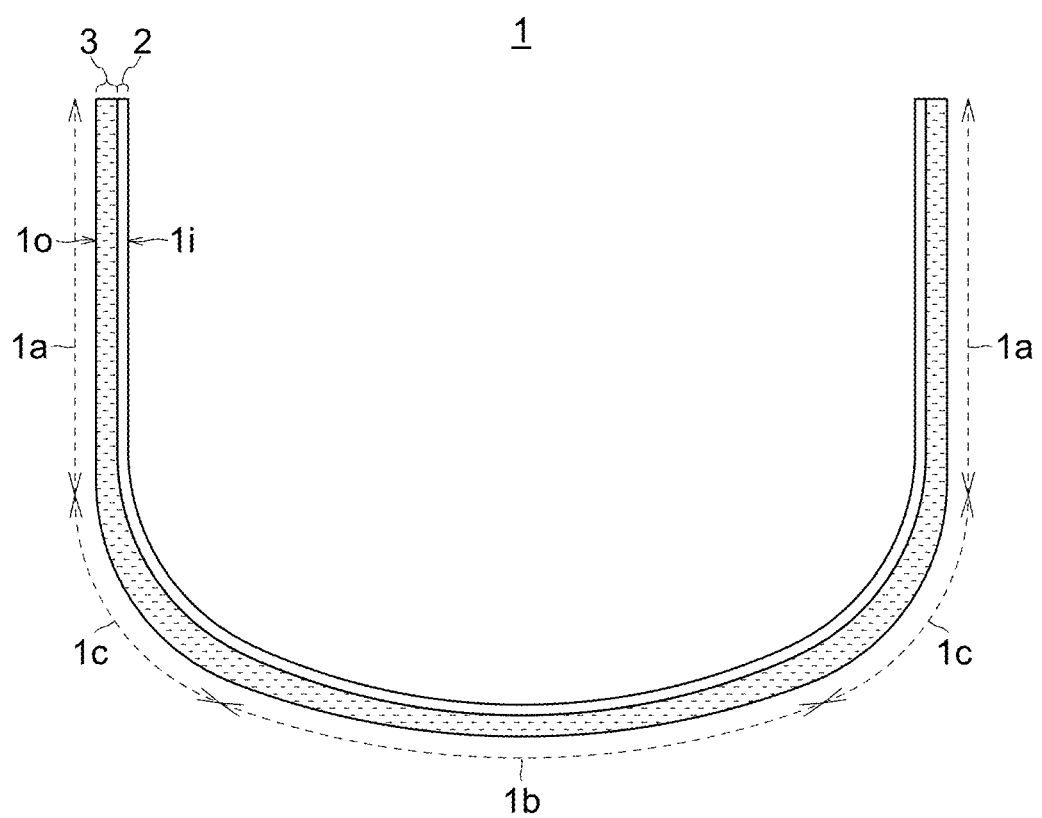
FIG. 1 is a schematic cross-sectional view illustrating a structure of a quartz crucible subjected to transmittance measurement according to the present invention.

FIG. 1 is a schematic cross-sectional view illustrating a structure of a quartz crucible subjected to transmittance measurement according to the present invention.

As illustrated in FIG. 1, a quartz crucible 1 is a bottomed cylindrical container for holding a silicon melt and has a cylindrical sidewall section 1a, a gently curved bottom section 1b, and a corner section 1c having a curvature larger than that of the bottom section 1b and connecting the sidewall section 1a and the bottom section 1b.

The quartz crucible 1 preferably has a diameter of 24 inches (about 600 mm) or more and, more particularly, 32 inches (about 800 mm) or more. This is because such a large-diameter crucible is used for pulling up a large-sized silicon single crystal ingot having a diameter of 300 mm or more and is required to have no adverse effects on the quality of the single crystal even with long-term usage. Although the thickness of the crucible slightly differs from one section to another, the thickness of the sidewall section 1a of a large-sized crucible having a diameter of 32 inches or more is typically 10 mm or more.

The quartz crucible 1 includes a transparent layer 2 (bubble-free layer) made of quartz glass containing substantially no bubbles and an opaque layer 3 (bubble layer) made of quartz glass containing a large number of micro-bubbles and provided outside the transparent layer 2.

The transparent layer 2 is a layer constituting an inner surface 1i of the crucible that contacts a silicon melt and is provided for preventing a single crystallinity from being reduced due to the bubbles in the quartz glass. The thickness of the transparent layer 2 is preferably 0.5 mm to 10 mm and is set to an adequate value in this range for each location of the crucible so as to prevent the transparent layer 2 from being completely eliminated due to erosion during a single crystal pulling-up process and prevent the opaque layer 3 from being exposed. The transparent layer 2 is preferably formed over the entire surface of the crucible from the sidewall section 1a to bottom section 1b; however, it may be omitted at the upper end portion (rim portion) of the crucible that does not contact a silicon melt.

The phrase "containing substantially no bubbles" means that the transparent layer 2 has such a bubble content and size that does not reduce a single crystallinity. When even a slight amount of bubbles exist in the vicinity of the inner surface of the crucible, the bubbles in the vicinity of the crucible inner surface cannot be confined within the quartz glass due to the erosion of the crucible inner surface. This may cause the bubbles in the quartz glass to burst due to thermal expansion during a crystal pull-up process to peel crucible pieces (quartz pieces). When the crucible pieces released into a melt are transported by melt convection to the growth interface of a single crystal to be entrapped into the single crystal, dislocations may be generated in the single crystal. Alternatively, when the bubbles released into a melt due to the erosion of the crucible inner surface float up to the solid-liquid interface to be entrapped in the single crystal, pinholes may be generated. The bubble content of the transparent layer 2 is preferably 0.1 vol % or less, and the average diameter of the bubbles is preferably 100 μm or less.

The bubble content of the transparent layer 2 can be nondestructively measured by using an optical detection means. The optical detection means is provided with a light receiving unit that receives a transmitted light or reflected light of the light irradiated onto the crucible. A light emitting means for irradiating light may be built in the light receiving unit, or an external light emitting means may be employed. The optical detection means is preferably rotatably operated along the inner surface of the crucible. The irradiation light may be X-ray or laser as well as visible light, ultraviolet light and infrared light. The light receiving unit may be a digital camera including an optical lens and an imaging element. Measurement results obtained by the optical detection means are input to an image processing unit, where the bubble content per unit area is calculated.

The bubble content per unit volume can be calculated by integrating the bubble content per unit area in the depth direction. To detect bubbles existing at a predetermined depth from the surface, the focus of the optical lens may be scanned in the depth direction from the surface. The bubble content per unit area can be calculated as a ratio of the occupied area of the bubbles to each of reference areas which are obtained by dividing an image of the crucible inner surface photographed by the digital camera into predetermined areas.

The opaque layer 3 is a layer constituting an outer surface 1o of the crucible and is provided for enhancing the heat retaining property of the silicon melt in the crucible and for dispersing radiant heat from a heater, which is provided in a single crystal pull-up unit so as to surround the crucible, to heat the silicon melt in the crucible as uniformly as possible. To this end, the opaque layer 3 is formed over the entire surface of the crucible from the sidewall section 1a to the bottom section 1b. The thickness of the opaque layer 3 is substantially equal to a value obtained by subtracting the thickness of the transparent layer 2 from the thickness of the crucible wall and differs from one portion to another in the crucible. The temperature of the silicon melt is determined by the amount of transmission of the radiant heat from the heater through the opaque layer 3, so that the state (the number, size, and density) of the bubbles in the crucible is an important factor.

To control the oxygen concentration of the silicon single crystal in the CZ method, an adequate transmittance needs to be set for each portion of the quartz crucible 1. To this end, it is necessary to correctly measure the transmittance of each portion of the quartz crucible 1.

Figure 2:
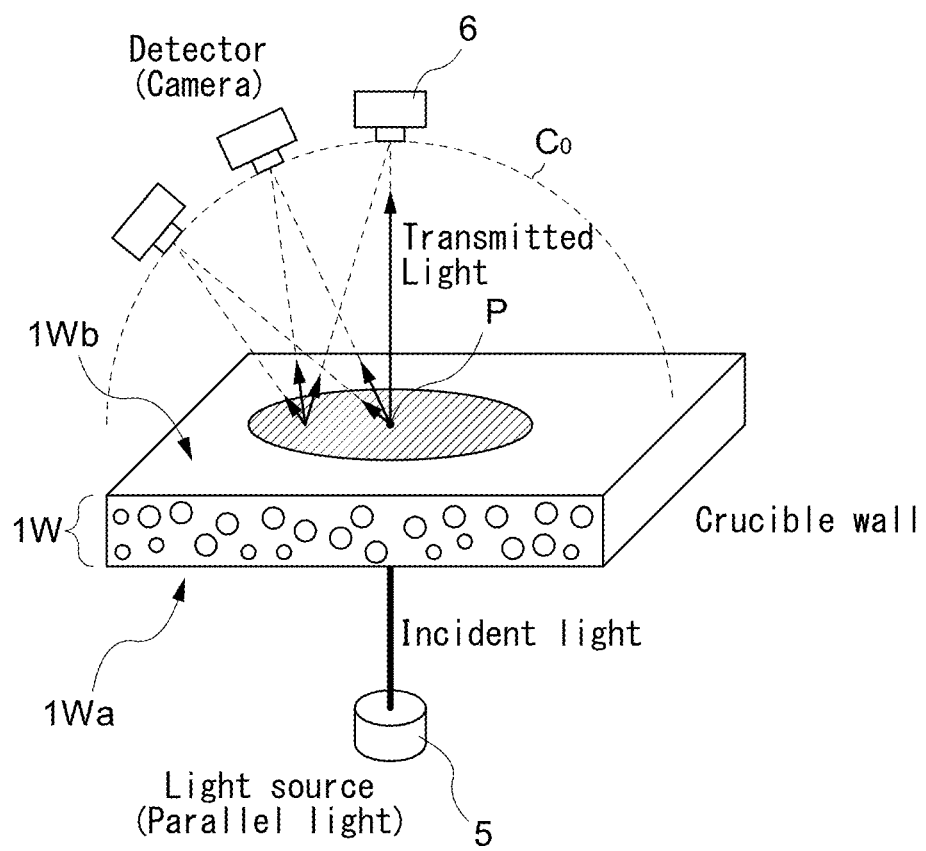
FIG. 2 is a schematic view for explaining the principle of a method of measuring the transmittance of the quartz crucible according to the present invention.
Figure 3A:
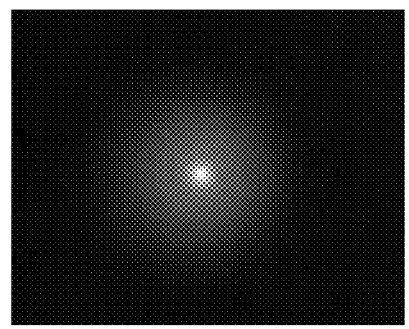
FIGS. 3A and 3B are schematic views for explaining the principle of a method of measuring the transmittance of the quartz crucible according to the present invention, and particularly
Figure 3B:
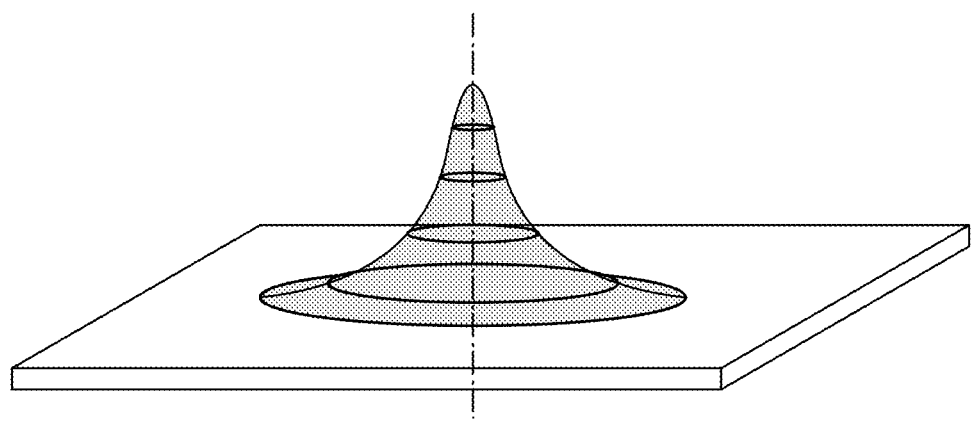

FIG. 2 and FIGS. 3A and 3B are schematic views for explaining the principle of a method of measuring the transmittance of the quartz crucible according to the present invention.

As illustrated in FIG. 2, the transmittance measurement method according to the present invention is featured as follows. That is, a light source 5 is disposed on one wall surface 1Wa (crucible outer surface) side of a wall body 1W of the quartz crucible 1, and a detector 6 such as a camera is disposed on the other wall surface 1Wb side so as to be opposed to the light source 5. Then, a parallel light is emitted from the light source 5, and the reception levels of the light that has been transmitted through the wall body 1W is measured by the detector 6. Meanwhile, the detector 6 is moved along the circle centered around a light exit point P on the other wall surface 1Wb (crucible inner surface) to measure the reception levels of the light transmitted through the quartz crucible at a plurality of measurement positions. In this case, the transmittance can be calculated as a ratio of the total energy of the transmitted light to the total energy of the incident light, and the total energy of the transmitted light can be calculated as the sum of the reception levels of the transmitted light measured at the plurality of measurement positions.

The light entering the one wall surface 1Wa of the wall body 1W passes inside the wall body 1W and exits from the other wall surface 1Wb; however, the quartz crucible 1 has the opaque layer 3 (see FIG. 1) containing a large number of micro-bubbles as described above, so that the transmitted light scatters inside the wall body 1W. Thus, as illustrated in FIG. 3A, although the luminance of the light transmitted through the quartz crucible is very high at the center, the area surrounding the center is also faintly bright, so that it can be found that the parallel light scatters. Such energy distribution of the transmitted light becomes rotationally symmetric distribution that spreads concentrically around the light exit position, as illustrated in FIG. 3B.

Figure 15:
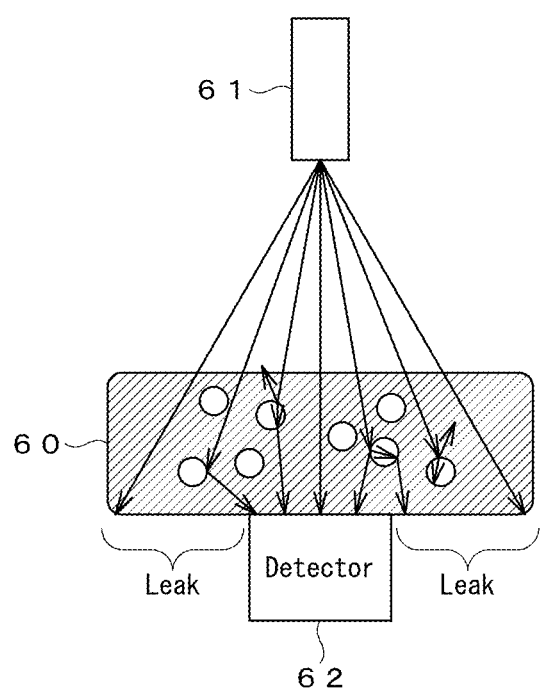
FIG. 15 is schematic view for explaining a conventional transmittance measurement method.

When the measurement is performed with the detector 6 fixedly disposed right in front of the light source 5 as in the conventional transmittance measurement method, the scattering light leaks outside the detector 6 as illustrated in FIG. 15, failing to receive the transmitted light without omission. On the other hand, in the present invention, the transmitted light is measured with the detector 6 disposed at a plurality of positions on a circle $C_0$ centered around the exit point P of the transmitted light, so that it is possible to correctly measure the transmittance of the quartz crucible 1 in a noncontact and nondestructive manner. The following describes details of the transmittance measurement method according to the present invention.

Figure 4:
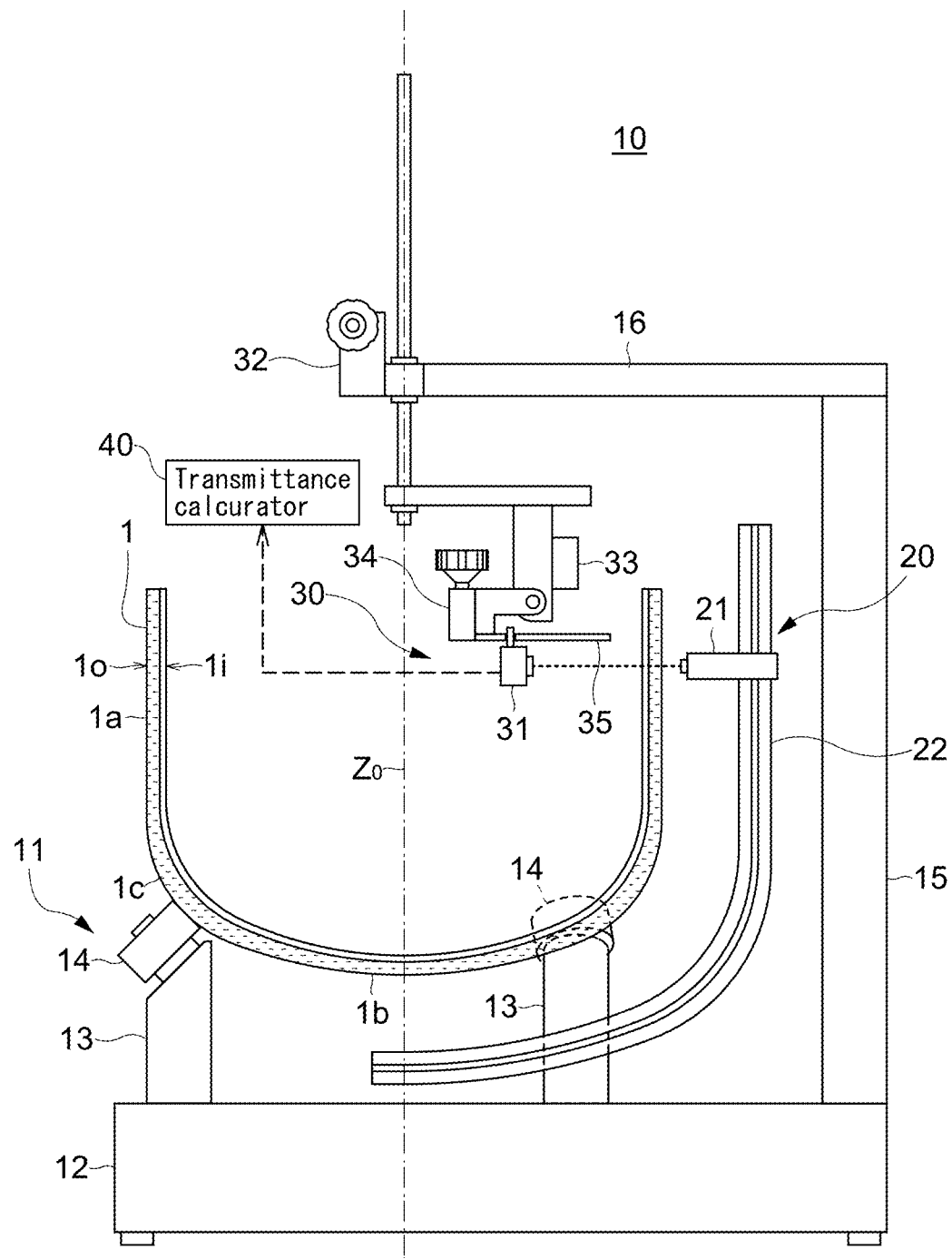
FIG. 4 is a schematic cross-sectional side view illustrating a configuration of an apparatus for measuring the transmittance of the quartz crucible according to a preferred embodiment of the present invention.
Figure 5:
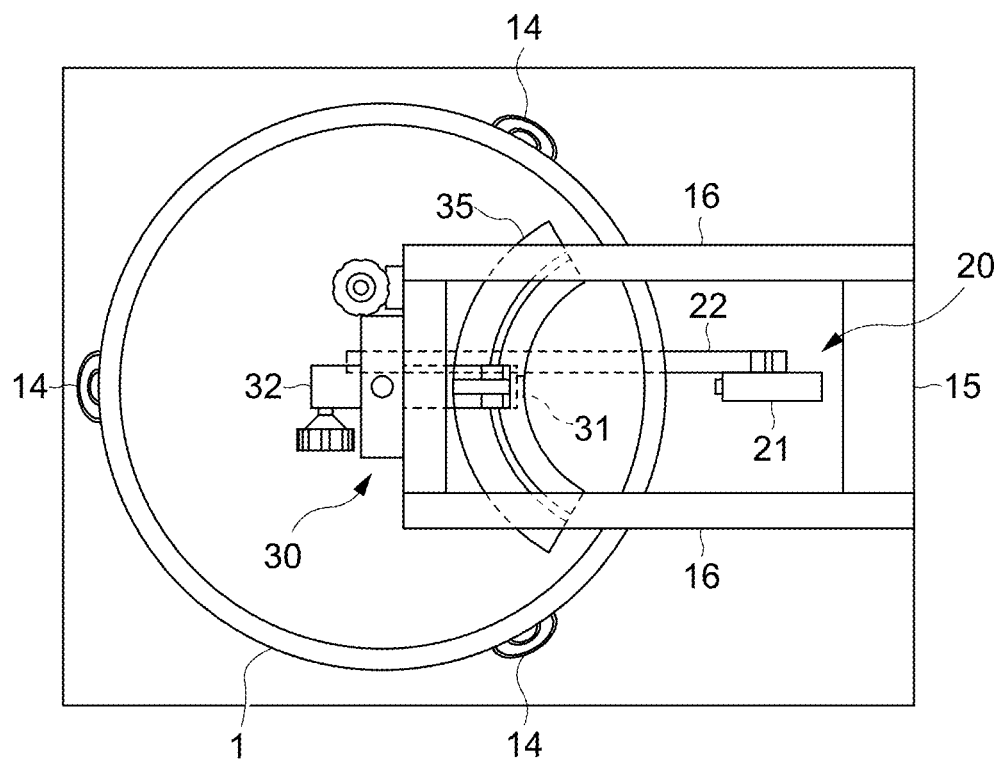
FIG. 5 is a schematic plan view illustrating a configuration of an apparatus for measuring the transmittance of the quartz crucible according to a preferred embodiment of the present invention.

FIGS. 4 and 5 are views illustrating a configuration of an apparatus for measuring the transmittance of the quartz crucible according to a preferred embodiment of the present invention. FIG. 4 is a schematic cross-sectional side view, and FIG. 5 is a schematic plan view.

As illustrated in FIGS. 4 and 5, a transmittance measurement apparatus 10 according to the present embodiment includes a support unit 11 that supports the quartz crucible 1 at three points, a light projector 20 disposed outside the quartz crucible 1, a light receiver 30 disposed inside the quartz crucible 1, and a transmittance calculator 40 that calculates a transmittance based on the reception levels, measured by the light receiver 30, of a light transmitted through the quartz crucible 1.

The support unit 11 has a support base 12, three support columns 13 vertically installed on the support base 12, and rotating rollers 14 provided at the distal ends of the three support columns 13. The rotation axis of each rotating roller 14 is obliquely inclined, whereby the outer circumferential surface of the corner section 1c of the quartz crucible 1 is rotatably supported at three points by the circumferential surfaces of the three rotating rollers 14. The quartz crucible 1 may be rotated manually, or may be rotated automatically by using a drive mechanism such as a motor.

The support unit 11 further has an upper frame 15 vertically installed on the support base 12 and a beam part 16 extending horizontally from the upper end portion of the upper frame 15. The beam part 16 supports the light receiver from above. The upper frame 15 supports the light projector 20.

The light projector 20 has a laser unit 21 that outputs laser light and a guide rail 22 provided along the outer surface of the quartz crucible 1. The laser unit 21 serves as a light source that outputs a parallel light and is configured to be freely slidable along the guide rail 22. This allows the laser unit 21 to move from the upper end of the rim of the crucible to the center of the bottom section 1b along the outer surface 1o of the quartz crucible 1 and to be set to a desired position such that the emission direction of the laser light is always perpendicular to the crucible wall surface. The slide operation of the laser unit 21 may be performed manually, or may be performed automatically by using a drive mechanism such as a motor. The guide rail 22 and drive mechanism constitute a light projection position changing means for vertically moving the laser unit 21 along the outer wall surface of the quartz crucible 1. When the laser light enters the crucible wall surface perpendicularly, reflection and refraction at the wall surface can be minimized to enhance incident position accuracy; however, the laser light need not enter the crucible wall surface strictly perpendicularly.

The light receiver 30 has a camera 31 as a detector, a camera elevating mechanism 32 for elevating the camera 31, a camera turning/tilting mechanism 33 for turning/tilting the camera 31 in a vertical plane including the rotation axis of the quartz crucible 1, and a camera turning mechanism 34 for turning the camera 31 along a circle centered around the exit point (i.e., intersection between a laser light axis and inner surface 1i of the quartz crucible 1) of the laser light on the inner surface 1i of the quartz crucible 1. By using, as the detector, a device having a wide light reception range, such as a CCD camera, it is possible to detect the energy of the transmitted light in a wide range.

The camera elevating mechanism 32 and the camera turning/tilting mechanism 33 are operated in a cooperative manner, whereby, like the light projector 20, the camera 31 can be moved along the inner surface 1i of the quartz crucible 1 from the upper end of the rim to the center of the bottom section 1b. That is, the camera elevating mechanism 32 and camera turning/tilting mechanism 33 constitute a reception position changing means for vertically moving the camera 31 along the inner wall surface of the quartz crucible. Further, as illustrated in FIG. 5, the camera turning mechanism 34 can turn the camera 31 by moving the camera 31 along a guide rail 35 such that the photographing direction of the camera 31 always faces the exit point of the laser light. The turning operation of the camera 31 may be performed manually.

The camera 31 is driven together with the camera turning mechanism. 34 including the circular-arc shaped guide rail 35, whereby the orientation (tilt angle) of the camera 31 in the vertical direction is adjusted. Further, the camera 31 is driven to be elevated and lowered together with the camera turning/tilting mechanism 33 and camera turning mechanism 34, whereby the vertical position of the camera 31 is adjusted. The turning angle of the camera 31 can be desirably set independently of the operations of the camera elevating mechanism 32 and camera turning/tilting mechanism 33. Even when the laser unit 21 and the camera 31 are moved to any position in the vertical direction along the crucible wall surface, the distance between the center point of the laser light exiting from the crucible surface and the camera 31 is controlled to be always constant.

Image data obtained by the camera 31 is processed in the transmittance calculator 40, and a transmittance T is calculated from an integrated value of the illuminance level of each pixel. Assuming that the total energy (blank value) of the incident light calculated from image data obtained when light emitted from the laser unit 21 is directly photographed by the camera 31 without through the quartz crucible 1 is $I_0$, and the total energy of the transmitted light calculated from image data obtained when the transmitted light through the quartz crucible 1 is photographed by the camera 31 is I, the transmittance T can be calculated as $T=I/I_0$.

The positioning of the laser unit 21 and camera 31 is preferably performed under computer control, but may be performed manually. Normally, the measurement points of the transmittance of the quartz crucible 1 are predetermined. In many cases, the measurement is performed, for example, at three points of the sidewall section 1a, corner section 1c, and bottom section 1b, or at four points of the upper portion of the sidewall section 1a, lower portion of the sidewall section 1a, corner section 1c, and bottom section 1b. These points are marked so as to facilitate automatic or manual positioning of the laser unit 21 or camera 31, thus making the configuration of the transmittance measurement apparatus 10 simple.

Figure 6:
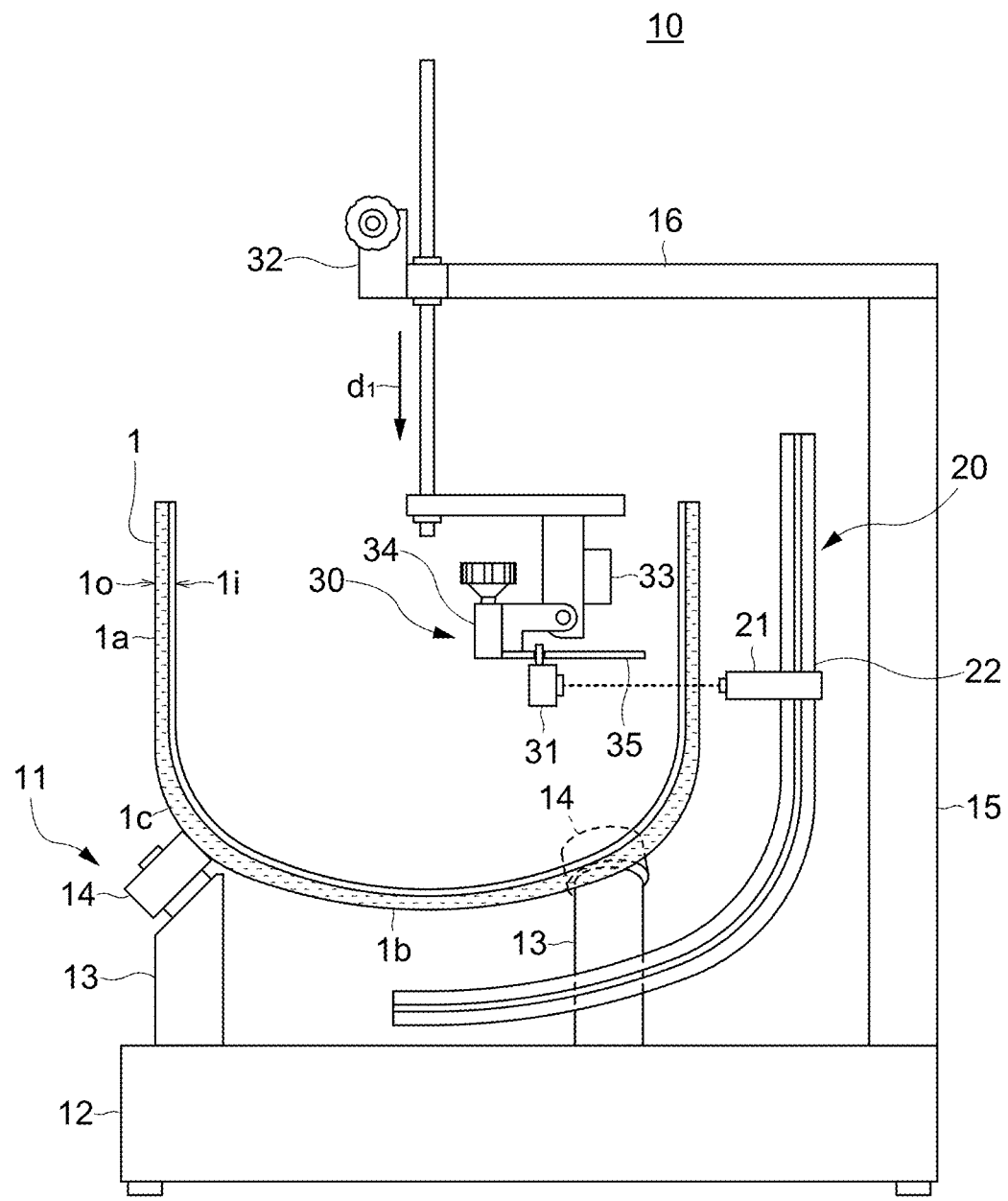
FIG. 6 is a schematic cross-sectional side view for explaining the elevating operation of the laser unit and camera along the crucible wall surface.
Figure 7:
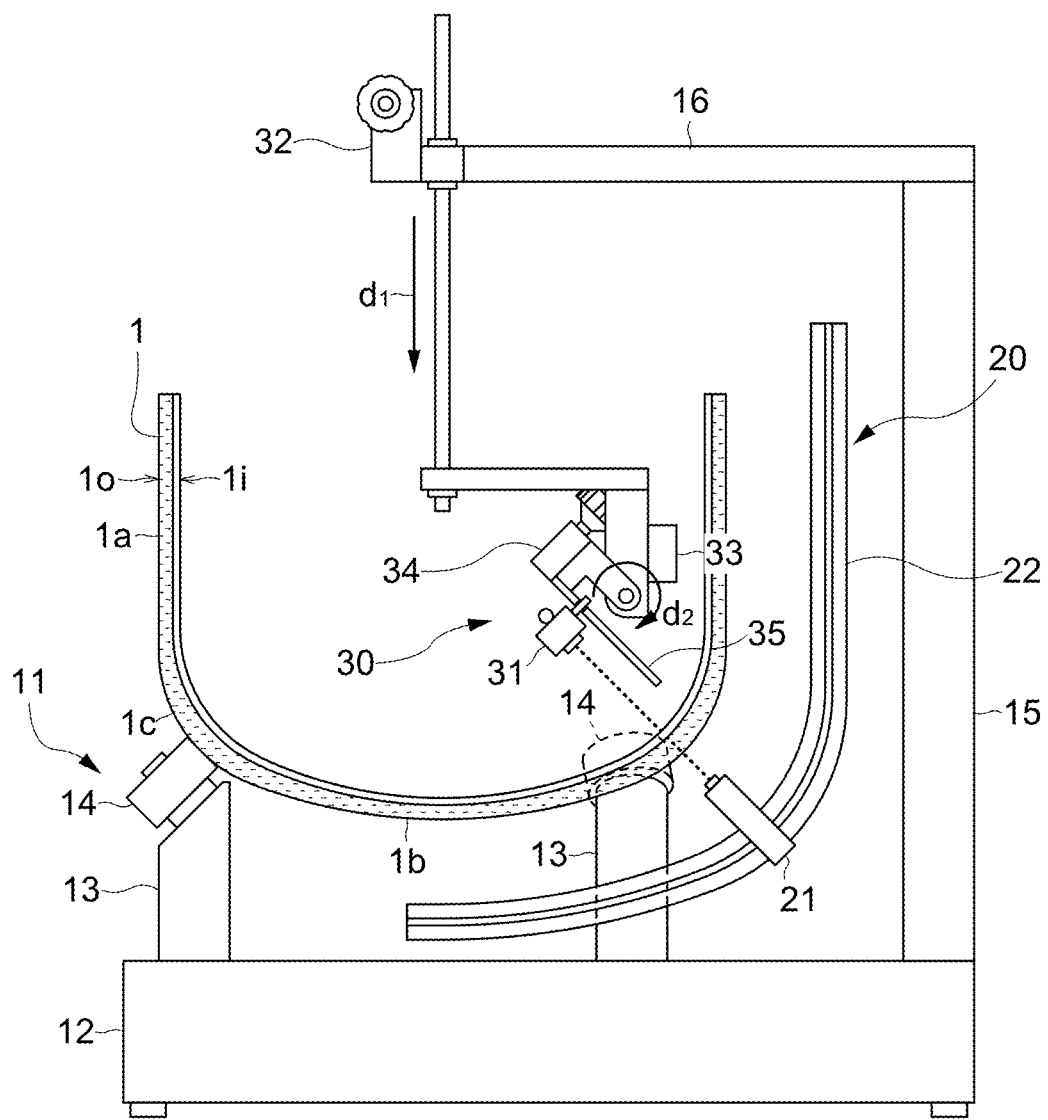
FIG. 7 is a schematic cross-sectional side view for explaining the elevating operation of the laser unit and camera along the crucible wall surface.
Figure 8:
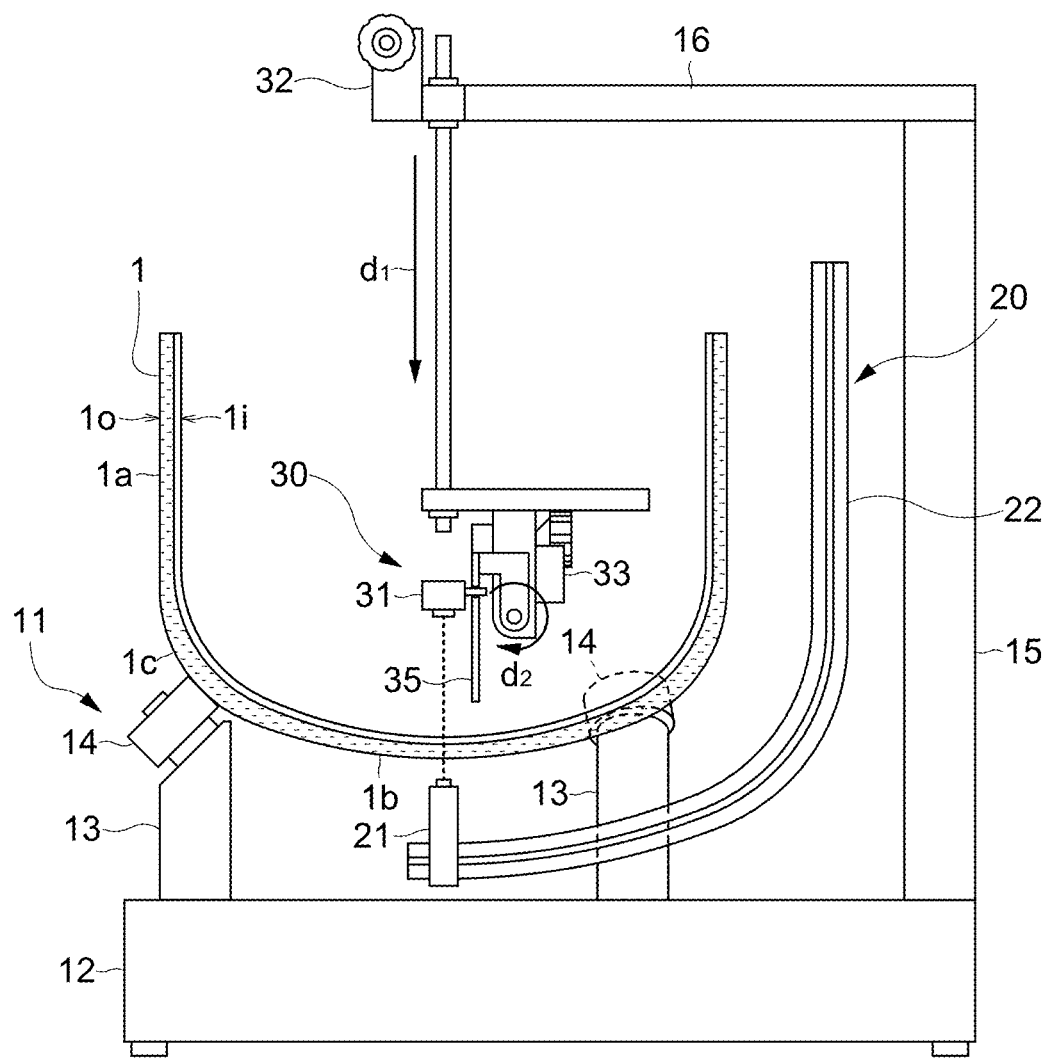
FIG. 8 is a schematic cross-sectional side view for explaining the elevating operation of the laser unit and camera along the crucible wall surface.

FIGS. 6 to 8 are schematic cross-sectional side views for explaining the elevating operation of the laser unit 21 and camera 31.

As illustrated in FIG. 6, the laser unit 21 and the camera 31 can be set to the measurement position at the lower portion of the sidewall section 1a of the quartz crucible 1. A change of the measurement position from the upper portion of the sidewall section 1a of the quartz crucible 1 illustrated in FIG. 4 to the lower portion of the sidewall section 1a illustrated in FIG. 6 can be performed by simply moving downward the laser unit 21 and camera 31 as denoted by the arrow $d_1$.

As illustrated in FIG. 7, the laser unit 21 and the camera 31 can be set to the measurement position at the corner section 1c of the quartz crucible 1. The position and orientation of the laser unit 21 at this time can be set by moving the laser unit 21 along the guide rail 22. The position and orientation of the camera 31 at this time can be set by the camera elevating mechanism 32 moving the camera 31 downward (see the arrow $d_1$) and by the camera turning/tilting mechanism 33 orienting the camera 31 obliquely downward (see the arrow $d_2$).

As illustrated in FIG. 8, the laser unit 21 and the camera 31 can be set to the measurement position at the bottom section 1b of the quartz crucible 1. The position and orientation of the laser unit 21 at this time can be set by moving the laser unit 21 along the guide rail 22. The position and orientation of the camera 31 at this time can be set by the camera elevating mechanism 32 moving the camera 31 downward (see the arrow $d_1$) and by the camera turning/tilting mechanism 33 orienting the camera 31 right below (see the arrow $d_2$).

Figure 9:
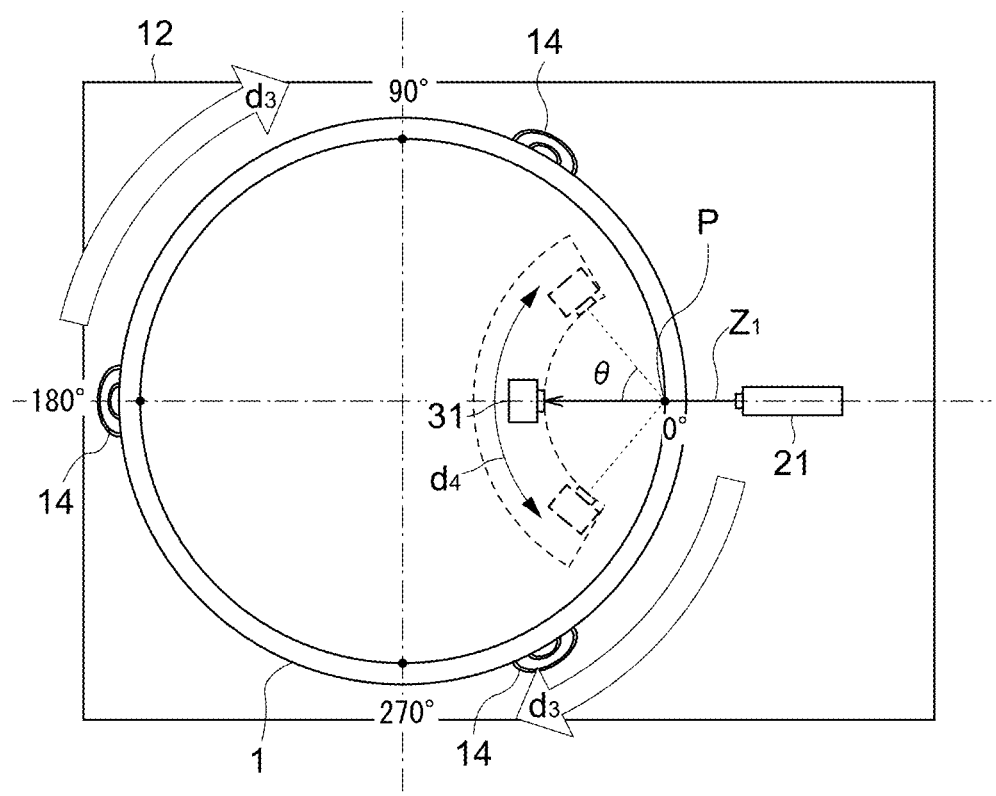
FIG. 9 is a schematic plan view for explaining the turning operation of the camera and rotating operation of the quartz crucible.

FIG. 9 is a schematic plan view for explaining the turning operation of the camera 31 and rotating operation of the quartz crucible 1.

As illustrated in FIG. 9, the camera 31 is slid along the guide rail 35 in the direction of the arrow $d_4$ and can thus be turned in a plane including a laser light axis $Z_1$. As a result, the camera 31 can be moved to a desired position on a circle centered around the exit point P of the laser light for measurement of the transmittance of the crucible 1. In order to enhance measurement accuracy of the transmittance, a maximum turning angle θ of the camera 31 is preferably set to 45° or greater.

The quartz crucible 1 can be rotated on the support base 12 as denoted by the arrow $d_3$. It follows that the measurement position (measurement line in the vertical direction) of the transmittance of the quartz crucible 1 can be changed in the circumferential direction. For example, the measurement can be performed at four positions corresponding to the crucible rotation angles of 0°, 90°, 180°, and 270°.

Figure 10:
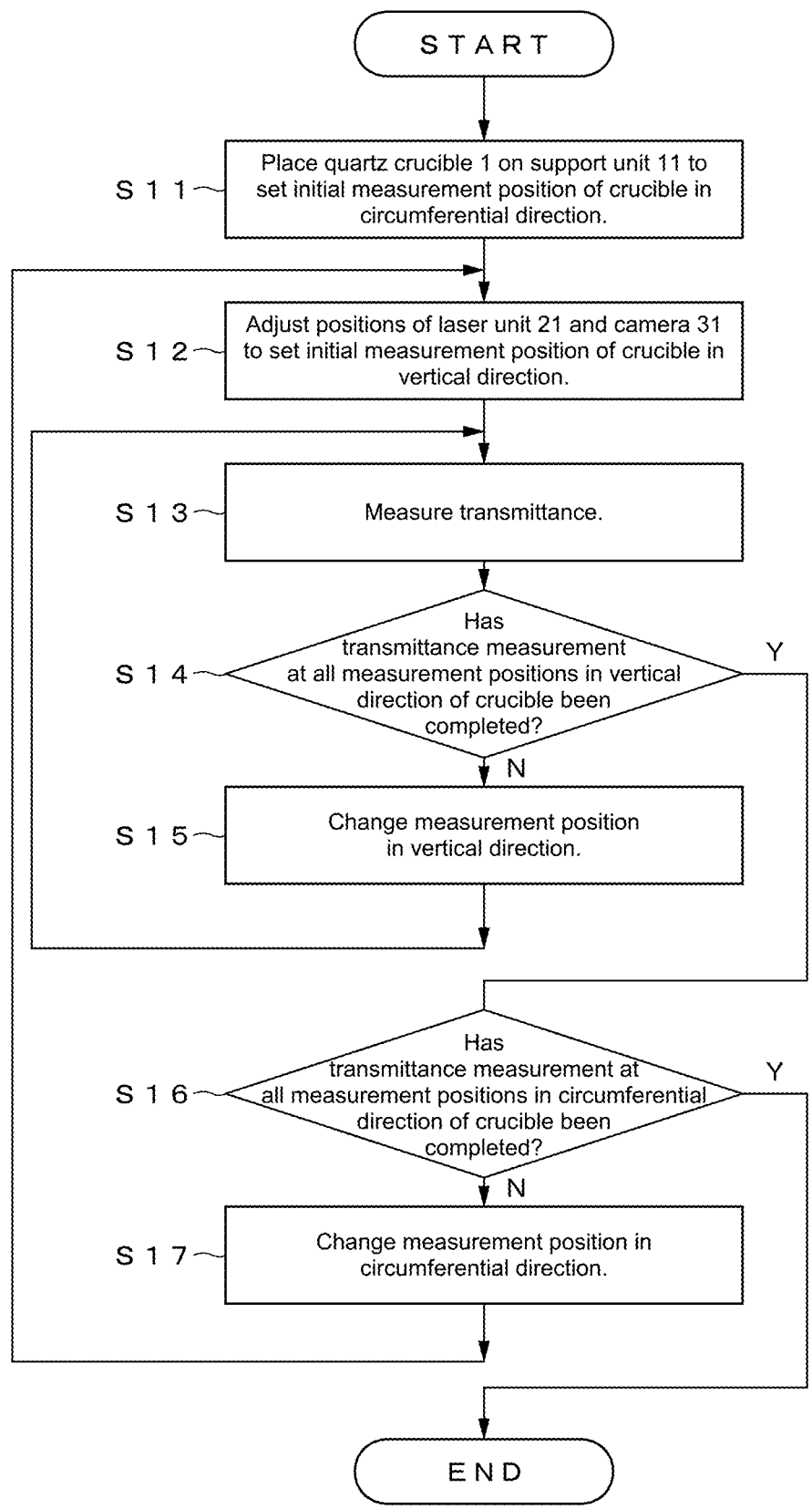
FIG. 10 is a flowchart for explaining an example of the method of measuring the transmittance of the quartz crucible using the transmittance measurement apparatus according to the present embodiment.
Figure 11:
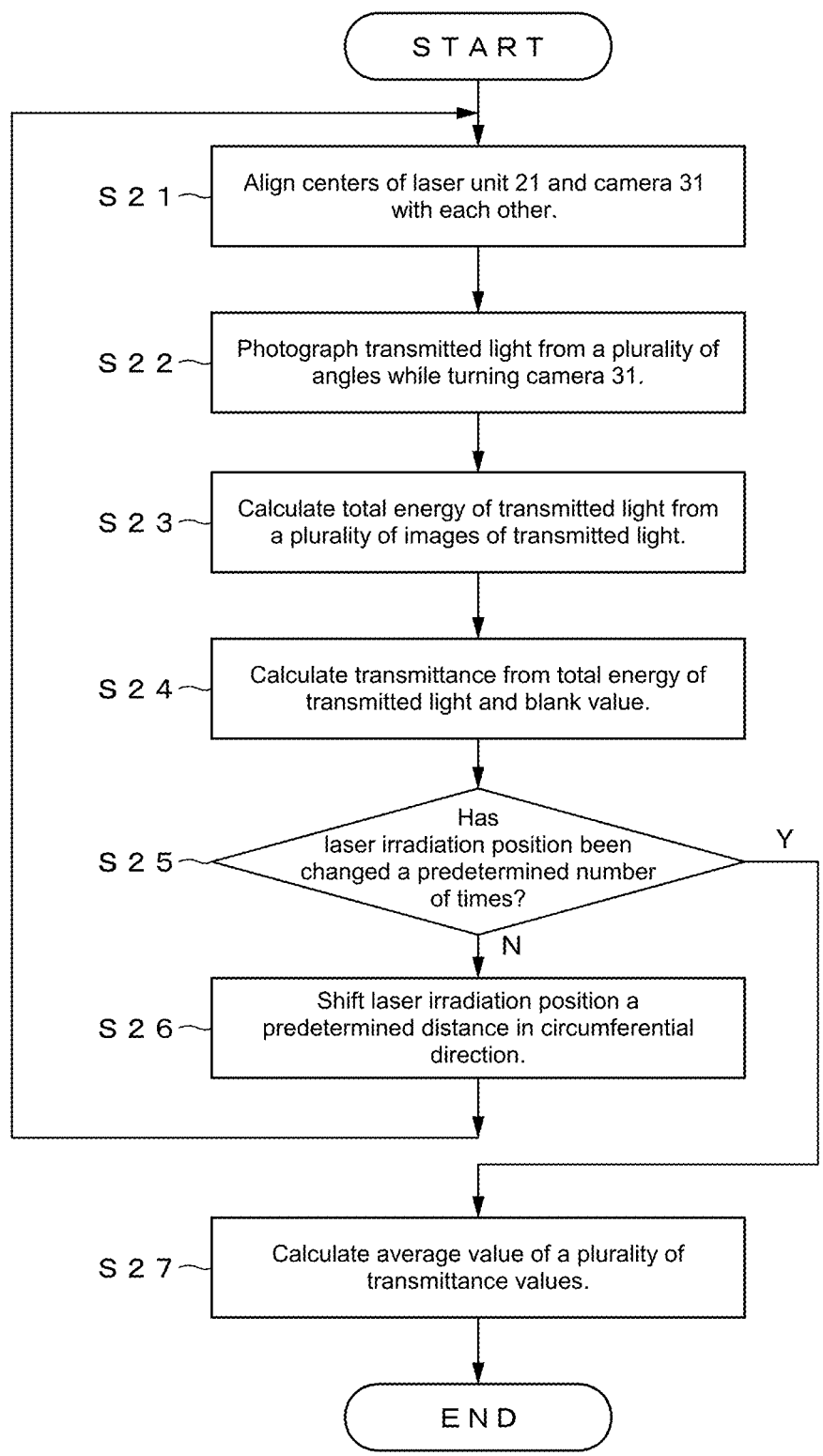
FIG. 11 is a flowchart for explaining an example of the method of measuring the transmittance of the quartz crucible using the transmittance measurement apparatus according to the present embodiment.

FIGS. 10 and 11 are flowcharts for explaining an example of the method of measuring the transmittance of the quartz crucible 1 using the transmittance measurement apparatus 10 according to the present embodiment.

As illustrated in FIG. 10, in the transmittance measurement according to the present embodiment, the quartz crucible 1 is placed on the support base 12. That is, the initial measurement position (position corresponding to a crucible rotation angle of 0°) of the quartz crucible 1 in the circumferential direction is set (step S11).

Then, the vertical positions of the laser unit 21 and camera 31 are adjusted to set the initial measurement position of the crucible in the vertical direction (step S12). For example, as illustrated in FIG. 4, the vertical positions of the laser unit 21 and camera 31 are aligned with the upper portion of the sidewall section 1a of the quartz crucible 1. Then, the transmittance of the quartz crucible 1 is measured at this measurement position (step S13). The transmittance measurement method at the individual measurement positions will be described later.

When the measurement of transmittance at all measurement positions in the vertical direction of the quartz crucible 1 is not completed even after the above measurement, the laser unit 21 and the camera 31 are moved in the vertical direction along the crucible wall surface to change the measurement position in the vertical direction of the crucible. Specifically, the transmittance is sequentially measured at the four points of the upper portion of the crucible sidewall section 1a (initial measurement position), the lower portion of the sidewall section 1a, the corner section 1c, and the bottom section 1b (steps S14N, S15, and S13). The number of the measurement points in the vertical direction of the crucible is not limited to four, but may be any value. When the number of the measurement points is increased, the distribution of the transmittance inside the crucible can be measured finely, while throughput lowers.

On the other hand, when the measurement of transmittance at all measurement positions in the vertical direction of the quartz crucible 1 is completed, it is determined whether the measurement of transmittance at all measurement positions in the circumferential direction of the crucible is completed (step S16). When it is determined that the measurement of transmittance at all measurement positions in the circumferential direction of the crucible is completed, the measurement of transmittance of the crucible is ended (step S14Y and step S16Y).

When the measurement of transmittance at all measurement positions in the circumferential direction of the quartz crucible 1 is not completed even after the above measurement, the quartz crucible 1 is rotated to change the measurement position in the circumferential direction of the crucible, and the laser unit 21 and the camera 31 are set back to the initial measurement position in the vertical direction of the crucible 1 (step S16N, S17, and S12). Specifically, the crucible is rotated by 90° to relatively move the laser unit 21 and the camera 31 to the next measurement position, and the transmittance is sequentially measured at four points corresponding to the crucible rotation angles of 0° (initial measurement position), 90°, 180°, and 270°. The number of the measurement points in the circumferential direction of the crucible is not limited to four, but may be any value. When the number of the measurement points is increased, the distribution of the transmittance inside the crucible can be measured finely, while throughput lowers.

The following describes details of the transmittance measurement method at the individual measurement positions.

As illustrated in FIG. 11, in the measurement of transmittance at the individual measurement position, the center positions of the laser unit 21 and the camera 31 are aligned with each other (step S21). Specifically, the laser unit 21 is set to a predetermined measurement position, and a laser light is emitted toward the crucible. Then, the laser light that has passed through the crucible wall is photographed by the camera 31, and the position of the camera 31 is finely adjusted such that the center of the laser light is placed at substantially the center of the photographed image. The turning angle of the camera 31 at this time is 0°, and the camera 31 is opposed to the laser unit 21.

Then, the camera 31 is turned along the second guide rail 35 while maintaining a state where the laser light is emitted from the laser unit 21, and an image of the transmitted light is photographed from a plurality of angles (step S22). The pitch of the turning angle of the camera 31 is not particularly limited as long as the entire light transmitted through the crucible can be detected without omission, and an adequate pitch may be determined depending on conditions such as the size (angle-of-view) of the lens of the camera 31 and a distance between the camera 31 and the measurement point. Specifically, the pitch of the turning angle of the camera 31 may be 10°, for example. The camera 31 photographs the image of the laser light at a plurality of positions within a certain angle range from a reference position (0°), and the maximum turning angle is preferably larger than ±45°. By increasing the turning angle as much as possible to photograph more scattering light to be summed, measurement accuracy of the transmittance can be enhanced. The angle range of the camera 31 may be only a positive-side range or negative-side range.

Then, the total energy of the transmitted light is calculated from a plurality of images of the transmitted light photographed from a plurality of angles (step S23). The transmitted light spreads concentrically around the light exit position due to scattering inside the crucible wall (see FIG. 3A). Thus, in the calculation of the energy of the transmitted light, the photographed image is line-scanned to calculate a luminance profile with respect to the distance from the exit position center of the transmitted light (see FIGS. 14A and 14B). The luminance profile can be assumed to spread isotropically around the light exit position, so that a volume (see FIG. 3B) obtained by circumferentially rotating the luminance profile corresponds to the energy of the transmitted light photographed from a certain angle. Thus, the sum of the energy of a plurality of transmitted lights calculated from the plurality of images photographed at different angles corresponds to a total energy I of the transmitted light. The transmittance T can be calculated as the ratio ($T=I/I_0$) of the total energy I of the transmitted light to the total energy $I_0$ (blank value) of incident light (step S24). The total energy I of the transmitted light may be calculated by volume-integrating the sum of the luminance profiles of a plurality of transmitted lights calculated from the plurality of images photographed at different angles. That is, the order of calculation is not particularly limited.

Then, the irradiation position (vertical position of the laser unit 21) of the laser light is shifted, e.g., circumferentially a predetermined distance (e.g., 1 cm) along the crucible wall surface, and photographing is performed while turning the camera 31 as described above (step S25N, S26, S21 to S24). In this manner, measurement of the transmittance and change in the laser irradiation position are alternately performed a predetermine number of times (e.g., four times), whereby the measurement of transmittance at one measurement point (e.g., upper portion of the sidewall section 1a) is completed (step S25Y). Finally, a plurality of transmittance values obtained as measurement values are averaged (step S27). Thus, the transmittance is measured while slightly changing the laser irradiation position at one measurement point, and the obtained transmittance values are averaged, whereby it is possible to suppress the influence of a local variation in the measurement value of transmittance. The direction in which the irradiation position of the laser light is shifted for averaging processing is not limited to the circumferential direction and may be any direction.

As described above, in the measurement of transmittance at a plurality of points in the vertical direction of the quartz crucible 1, the laser unit 21 and the camera 31 are moved in the vertical direction of the crucible, whereby the transmittance is measured at, e.g., four points of the upper portion of the sidewall section 1a, the lower portion of the sidewall section 1a, the corner section 1c, and the bottom section 1b. Further, the quartz crucible 1 is rotated by a predetermined angle (e.g., 90°) to change the measurement position of the transmittance in the circumferential direction of the crucible, and the above-described measurement step in the vertical direction of the crucible is repeated, whereby the transmittance is measured at a plurality of points in the circumferential direction of the quartz crucible 1, i.e., at four angle positions of, e.g., 0°, 90°, 180°, and 270°. The transmittance values thus obtained at four positions in the circumferential direction are averaged, whereby it is possible to enhance measurement accuracy of the transmittance at each portion of the crucible (upper portion of the sidewall section 1a, lower portion of the sidewall section 1a, corner section 1c, and bottom section 1b).

As described above, in the method of measuring the transmittance of the quartz crucible according to the present embodiment, a parallel light is emitted from outside the quartz crucible, and a light transmitted through the quartz crucible is received by the camera disposed at a plurality of positions on a circle centered around the light exit point on the inner surface of the quartz crucible, whereby the amount of the transmitted light scattering inside the wall of the quartz crucible is measured in a wide range, and the transmittance of the quartz crucible is calculated based on the measurement results of the amount of the transmitted light obtained at a plurality of positions. Thus, the transmittance of the quartz crucible can be correctly calculated.

Further, the transmittance measurement apparatus for the quartz crucible according to the present embodiment has the camera turning mechanism for turning the camera along a circle centered around the light exit point on the inner surface of the quartz crucible. Thus, it is possible to receive the transmitted light while moving the camera to a plurality of positions on the circle centered around the light exit point on the inner surface of the quartz crucible and thus to calculate the transmittance of the quartz crucible based on the measurement results of the amount of the transmitted light obtained at a plurality of positions. Thus, the amount of the transmitted light scattering inside the wall of the quartz crucible can be measured in a wide range, whereby the transmittance of the quartz crucible can be correctly calculated.

Figure 12:
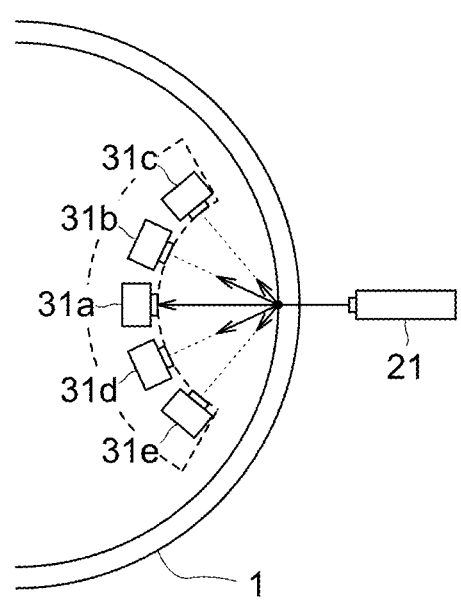
FIG. 12 is a schematic view illustrating a configuration of a transmittance measurement apparatus according to another preferred embodiment of the present invention.

FIG. 12 is a schematic view for explaining the feature of the transmittance measurement apparatus according to another preferred embodiment of the present invention.

As illustrated in FIG. 12, the transmittance measurement apparatus of the present embodiment is featured in that not a single camera 31 is turned to perform measurement, but a plurality of cameras (in this example, five cameras 31a to 31e) installed on a circle centered around the light exit point are used to simultaneously measure the transmittance at a plurality of positions (in this example, five measurement points). Other configurations are the same as those of the first embodiment. In a transmittance measurement method using this transmittance measurement apparatus, a number of cameras 31 equal to the number of the measurement positions are required; however, it is not necessary to turn the camera 31, thus making it possible to improve throughput.

Figure 13A:
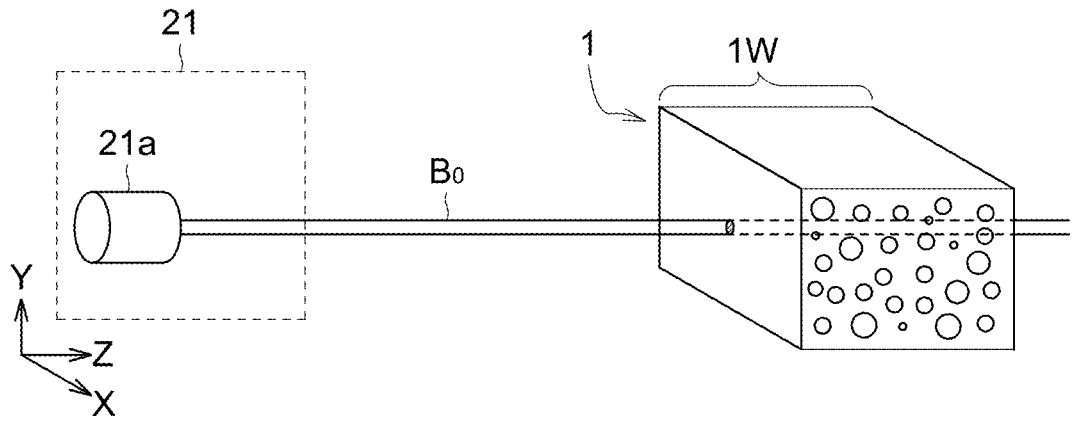
FIGS. 13A to 13C are schematic views illustrating an embodiment of the light projector 20.
Figure 13B:
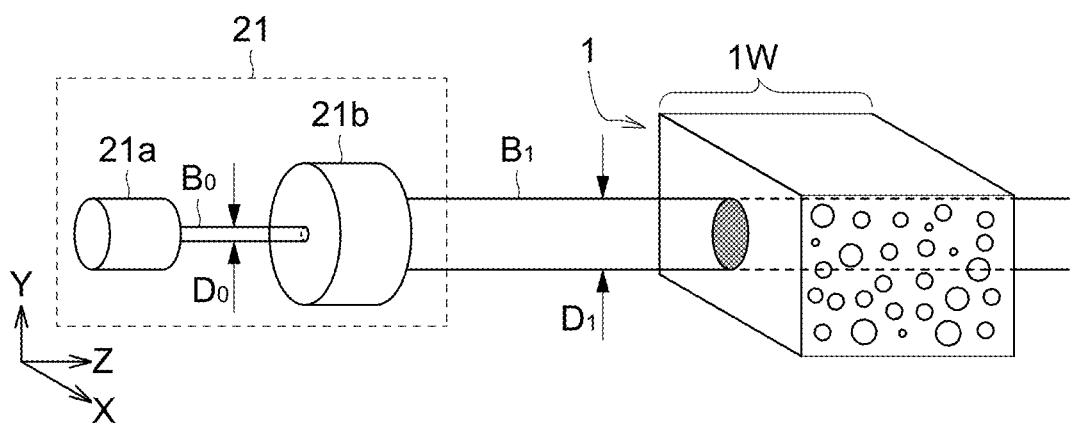
Figure 13C:
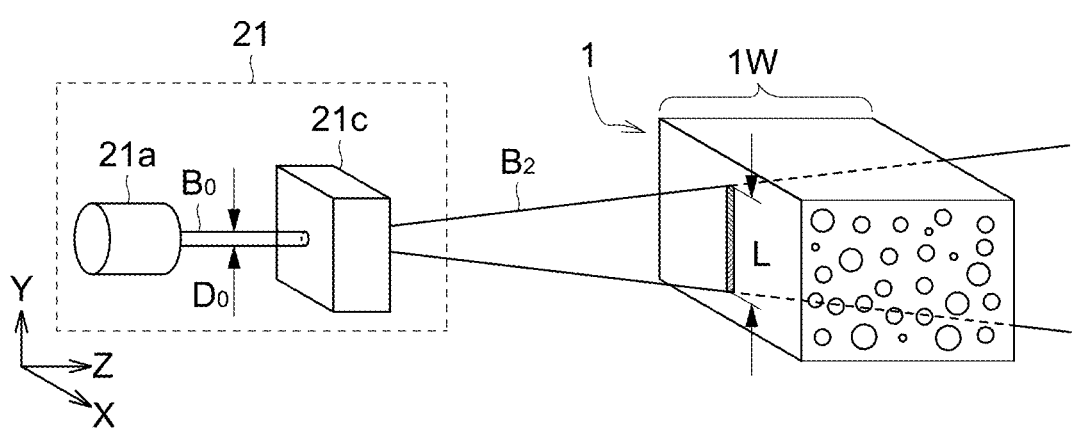

FIGS. 13A to 13C are schematic views illustrating an embodiment of the light projector 20.

The light projector 20 illustrated in FIG. 13A is configured to directly irradiate the wall body W1 of the quartz crucible 1 with a laser beam $B_0$ output from a laser light source 21a (laser oscillator) in the laser unit 21. The beam diameter of the laser beam laser beam $B_0$ output from the laser light source 21a is generally about 1 mm. When the beam diameter is small like this, a local transmittance of the quartz crucible 1 can be measured, while the measurement value of transmittance is likely to vary due to the influence of a local bubble density inside the crucible. In order to suppress the influence of the local variation in the bubble density so as to calculate a stable measurement value, it is necessary to perform measurement while locally changing some irradiation positions of the laser beam $B_0$ and to average a plurality of thus obtained measurement values. Thus, when the measurement is performed plurality of times, measurement time will be extended.

The laser unit 21 of the light projector 20 illustrated in FIG. 13B further has a beam expander 21b for expanding the beam diameter of the laser beam $B_0$ output from the laser light source 21a. The use of the beam expander 21b allows an increase in the beam diameter of a laser beam $B_1$ to be irradiated onto the wall body W1 of the quartz crucible 1, which reduces the influence of a local variation in the bubble density inside the wall body 1W of the quartz crucible 1, thereby making it possible to stably measure the transmittance. In particular, the effect of reducing the influence of a local variation in the bubble density due to expansion of the beam diameter becomes larger in a crucible with lower bubble density. Further, a transmittance with less influence of a local variation in the bubble density can be calculated at a single measurement, allowing a reduction in measurement time.

When the beam diameter is expanded using the beam expander 21b, the magnification ($D_1/D_0$) of the beam diameter is 2 or more, preferably 5 to 50, and more preferably 10 to 20. Alternatively, the expanded beam diameter (beam spot diameter) is 2 mm or more, preferably 5 mm to 50 mm, and more preferably 10 mm to 20 mm. When the magnification of the beam diameter is less than 2, or when the beam diameter is less than 2 mm, the substantial effect brought about by expanding the beam diameter cannot be obtained. The upper limit of the beam diameter or the magnification of the beam diameter can be freely set in consideration of the purpose of the measurement and device constraints. For example, the upper limit of the beam diameter can be set to 50 mm, and the upper limit of the magnification of the beam diameter can be set to 50.

The laser unit 21 of the light projector 20 illustrated in FIG. 13C further has a line generator 21c for converting the laser beam $B_0$ output from the laser light source 21a into a laser line light $B_2$. The above-described beam expander 21b expands the beam diameter in the two-dimensional direction, while the line generator 21c expands the beam diameter in the one-dimensional direction. The use of the line generator 21c can reduce the influence of a local variation in the bubble density inside the wall body 1W of the quartz crucible 1, thereby making it possible to stably measure the transmittance. Further, a transmittance with less influence of a local variation in the bubble density can be calculated at a single measurement, allowing a reduction in measurement time.

When the line generator 21c is used to expand the beam diameter in one direction, the magnification ($L/D_0$) of the beam diameter is 5 or more, preferably 10 to 200, and more preferably 50 to 100. Alternatively, the spot length (maximum width of the beam spot) L of the laser line light is 5 mm or more, preferably 10 mm to 200 mm, and more preferably 50 mm to 100 mm. When the magnification of the beam diameter is less than 5, or when the beam diameter is less than 5 mm, a substantial effect brought about by expanding the beam diameter cannot be obtained. The upper limit of the beam diameter or the magnification of the beam diameter can be freely set in consideration of the purpose of the measurement and device constraints. For example, the upper limit of the spot length of the laser line light can be set to 200 mm, and the upper limit of the magnification of the beam diameter can be set to 200.

When the line generator 21c is used, the longitudinal direction of the laser line light may be oriented to the circumferential direction of the quartz crucible 1 or vertical direction of the quartz crucible 1. In general, a variation in the bubble content in the vertical direction of the quartz crucible 1 is comparatively large, while a variation in the bubble content in the circumferential direction of the quartz crucible 1 is comparatively small. Thus, when the longitudinal direction of the laser line light is set parallel to the circumferential direction of the quartz crucible 1, it is possible to correctly measure the transmittance of a measurement point without being influenced by a change in the transmittance due to the bubble content. On the other hand, when the longitudinal direction of the laser line light is set parallel to the vertical direction of the quartz crucible 1, it is possible to calculate an average value of transmittance values comparatively largely varying due to the bubble content.

When the beam diameter of the laser beam output from the laser light source 21a is originally large, it is not necessary to separately prepare the above-described beam expander 21b or line generator 21c, thus making it possible to average the transmittance values and to reduce measurement time. However, when the laser light source 21a outputting a laser beam having a large beam diameter is used, it is difficult to measure the power of the laser beam using the power meter. The transmittance of the quartz crucible 1 is calculated from the ratio of the power of the transmitted light to the power of the incident light, and thus the measurement values of both the power of the incident light and the power of the transmitted light are necessary. When the power of the incident light is measured, the laser beam output from the laser light source 21a is directly received by the power meter; however, the diameter of the detection port of the power meter is small, so that it is difficult to measure the power of a beam having a large diameter. For such a reason, it is preferable to use the laser light source 21a outputting a laser beam having a small beam diameter than to use the laser light source 21a outputting a laser beam originally having a large beam diameter. Thus, it is preferable to expand the spot size of the laser light by using the beam expander 21b or line generator 21c separately prepared from the laser light source 21a.

As described above, when the beam expander 21b or line generator 21c added to the light projector 20 is used to irradiate the quartz crucible 1 with a laser beam having an expanded beam diameter, it is possible to detect a transmitted light in which the influences of a local variation in the bubble distribution of the quartz crucible 1 are averaged. Thus, the transmittance at any measurement point on the quartz crucible 1 can be stably measured, and the time for measuring the transmittance of the quartz crucible 1 can be reduced.

While the preferred embodiments of the present invention have been described, the present invention is not limited to the above embodiments, and various modifications may be made within the scope of the present invention. Accordingly, all such modifications are included in the present invention.

For example, in the method according to the above embodiment, the transmittance is measured at 16 points (4 points in the vertical direction of the quartz crucible 1×4 points in the circumferential direction thereof); however, the number of the measurement points may be increased for finer measurement.

Further, in the method according to the above embodiment, the transmittance is measured first at a plurality of measurement points on a measurement line in the vertical direction of the quartz crucible 1, and then the crucible is rotated by a predetermined angle in the circumferential direction so as to perform measurement at a plurality of measurement points on the next measurement line; alternatively, however, it is possible to first sequentially perform measurement at a plurality of measurement points on a measurement line in the circumferential direction of the quartz crucible 1 and then to change the vertical positions of the laser unit and camera. Further, various configurations may be applied to the transmittance measurement apparatus. For example, a multi-joint robot may be provided inside and outside the quartz crucible 1. In this case, the camera and light source may be attached to the leading ends of the multi-joint arms of the respective multi-joint robots.

Further, in the method according to the above embodiment, the quartz crucible is subjected to a nondestructive testing; however, destructive testing may be performed. Specifically, for example, the above-described measurement may be performed for a crucible piece cut out from the quartz crucible 1. Further, the wavelength of light is not limited in the present invention. Although, when, for example, an infrared light or a laser of a wavelength near the infrared light is used, the transmittance of an infrared light can be measured, the method according to the present invention can be applied to measurement of the transmittance of light of other wavelengths such as a visible light or an ultraviolet light.

EXAMPLES

The luminance profile of an infrared light transmitted through the quartz crucible having a diameter of 32 inches was measured using the transmittance measurement apparatus illustrated in FIG. 4 and the like. In this measurement, two quartz crucibles were prepared: a first crucible sample in which the thickness of the opaque layer at the sidewall section was about 10 mm; and a second crucible sample in which the thickness of the opaque layer at the sidewall section was about 15 mm. Then, the transmittance was measured according to the procedure illustrated in FIG. 11.

Figure 14A:
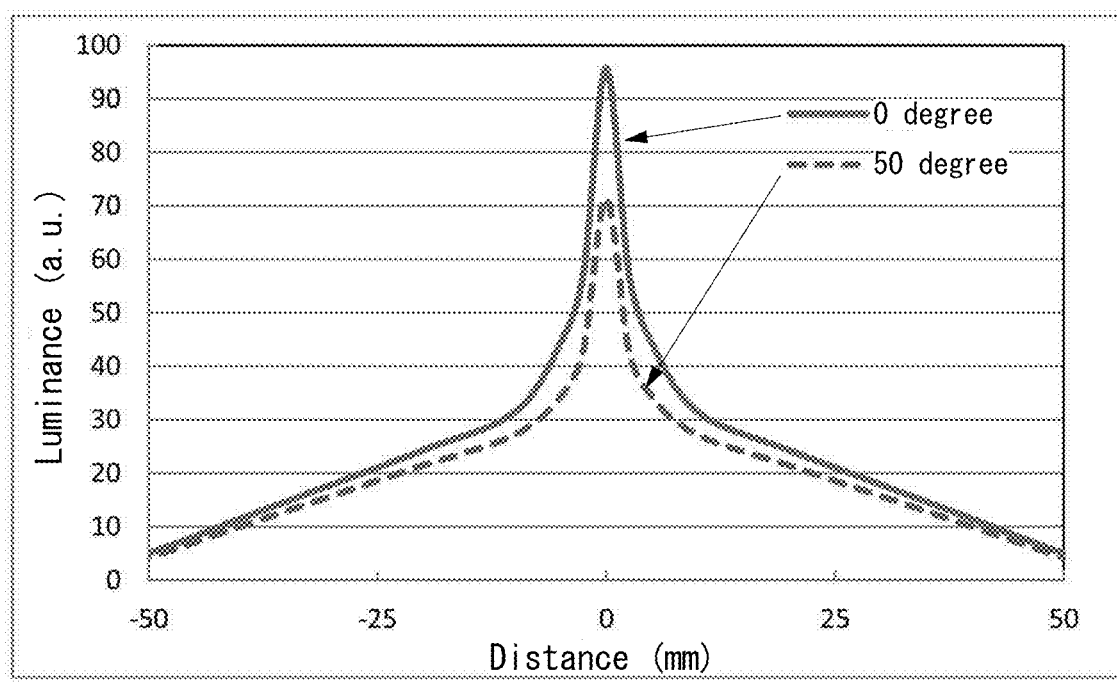
Figure 14B:
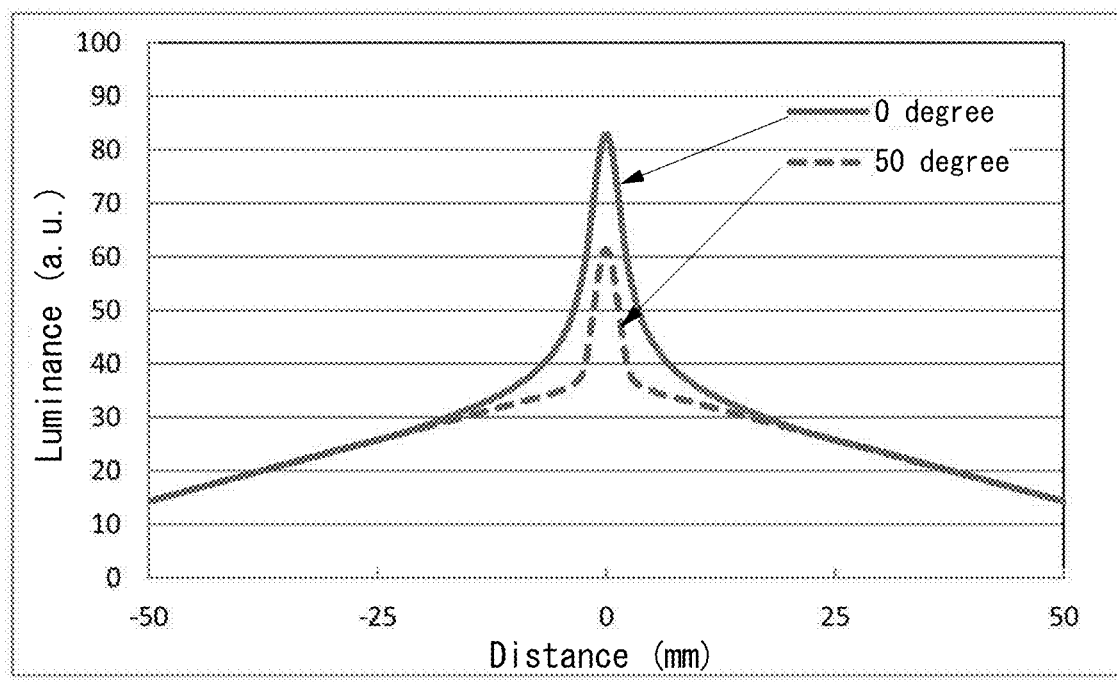

FIGS. 14A and 14B are graphs illustrating the luminance profile of the light transmitted through the quartz crucible. The horizontal axis represents the distance (mm) from the exit position of the transmitted light, and the vertical axis represents the luminance (relative value) of the transmitted light. FIGS. 14A and 14B each only illustrate the results obtained at positions corresponding to photographing angles of 0° and 50°, between which the angular difference is large.

As can be seen from FIG. 14A, the luminance profile of the first crucible sample has a substantially left-right symmetric pattern. Specifically, the luminance profile of the first crucible sample has a significant peak around the center of the light exit position, abruptly decreases within ±10 mm position from the center of the light exit position with increasing distance from the peak, and gradually decreases outside the ±10 mm position.

In the first crucible sample, the thickness of the opaque layer is comparatively as small as about 10 mm, so that the peak level of the luminance of the transmitted light at a photographing angle of 0° exceeds 90, which means that a high transmittance is exhibited. On the other hand, the peak level of the luminance of the transmitted light at a photographing angle of 50° is about 70, and it can be seen that the luminance level within ±10 mm position from the center of the light exit position is lower at a photographing angle of 50° than at 0°. However, in the area outside the ±10 mm position from the center of the light exit position, there is little difference in the luminance level due to the photographing angle.

As illustrated in FIG. 14B, the luminance profile of the second crucible sample also has a left-right symmetric pattern like the first crucible sample; however, the thickness of the opaque layer is about 15 mm, which is comparatively large, so that the luminance peak level is low. Specifically, the peak level of the luminance of the transmitted light at a photographing angle of 0° is 82, and that at a photographing angle of 50° is about 61. Thus, it can be seen that the transmittance is lower in the second crucible sample than in the first crucible sample.

As described above, although there is a slight difference in the luminance profile depending on the conditions of the opaque layer, it can be seen that the transmitted light of light entering the quartz crucible exhibits a luminance distribution spreading concentrically around the light exit position.

DESCRIPTION OF REFERENCE NUMERALS

1 Quartz crucible
1W Wall body of the quartz crucible
1Wa One wall surface of the quartz crucible
1Wb The other wall surface of the quartz crucible
1a: Sidewall section of the quartz crucible
1b: Bottom section of the quartz crucible
1c Corner section of the quartz crucible
1i Inner surface of the quartz crucible 1o Outer surface of the crucible
2 Transparent layer (bubble-free layer)
3 Opaque layer (bubble layer)
5 Light source
6 Detector
10 Transmittance measurement apparatus
11 Support unit
12 Support base
13 Support columns
14 Rotating roller
15 upper frame
16 Beam part
20 Light projector
21 Laser unit
21a Laser light source (laser oscillator)
21b Beam expander
21c Line generator
22 Guide rail
30 Light receiver
31, 31a-31e Camera
32 Camera elevating mechanism
33 Camera turning/tilting mechanism
34 Camera turning mechanism
40 Transmittance calculator
60 Crucible piece (quartz pieces)
61 Infrared lamp
62 Power meter
$C_0$ Circle

The invention claimed is:

1. A method of measuring transmittance of a quartz crucible, comprising:
emitting a parallel light from a light source disposed on a side of one wall surface of a quartz crucible toward a predetermined measurement point on the quartz crucible;
measuring reception levels of light transmitted through the quartz crucible at a plurality of positions by disposing a detector at the plurality of positions on a circle centered around an exit point of the parallel light on the other side of the wall surface of the quartz crucible;
calculating a transmittance of the quartz crucible at the predetermined measurement point based on a plurality of the reception levels of the transmitted light measured at the plurality of positions, wherein the transmittance is a ratio of total energy of light transmitted through the quartz crucible onto the detector to total energy of light directly transmitted onto the detector without being transmitted though the quartz crucible; and
measuring the transmittance at a plurality of measurement points different in position in the vertical direction of the quartz crucible by moving the positions of the light source and detector in the vertical direction along the wall surface of the quartz crucible.

2. The method of measuring transmittance according to claim 1, further comprising turning a single detector along the circle to position the detector at the plurality of positions.

3. The method of measuring transmittance according to claim 2, wherein a maximum turning angle of the detector with respect to a light axis of the parallel light is 45° or more.

4. The method of measuring transmittance according to claim 1, wherein:
the detector further includes a plurality of detectors previously disposed at the plurality of positions; and
the calculating of the transmittance of the quartz crucible includes using the plurality of detectors.

5. The method of measuring transmittance according to claim 1, further comprising:
disposing the light source outside the quartz crucible, disposing the detector inside the quartz crucible; and
measuring the transmittance of the quartz crucible in a nondestructive manner by receiving the parallel light emitted from the light source toward the quartz crucible using the detector.

6. The method of measuring transmittance according to claim 1, further comprising measuring the transmittance at a plurality of measurement points different in position in the circumferential direction of the quartz crucible by relatively moving the positions of the light source and detector with respect to the quartz crucible in the circumferential direction along the wall surface of the quartz crucible.

7. The method of measuring transmittance of a quartz crucible according to claim 1, wherein the parallel light is a laser beam output from a laser light source and having an expanded beam diameter.

8. The method of measuring transmittance of a quartz crucible according to claim 7, wherein the expanded beam diameter of the laser beam is 5 mm or more.

9. The method of measuring transmittance of a quartz crucible according to claim 1, wherein the parallel light is a laser line light converted from a laser beam output from a laser light source.

10. The method of measuring transmittance of a quartz crucible according to claim 9, wherein the spot length of the laser line light is 10 mm or more.

11. The method of measuring transmittance according to claim 1, wherein the measuring the transmittance includes tilting and moving the positions of the light source and detector together in the vertical direction along the wall surface of the quartz crucible.

12. A transmittance measurement apparatus for a quartz crucible comprising:
a light source disposed on a side of one wall surface of a quartz crucible and configured to emit a parallel light toward a predetermined measurement point on the quartz crucible;
at least one detector disposed at the other wall surface side of the quartz crucible and configured to receive light transmitted through the quartz crucible; and
a transmittance calculator configured to calculate the transmittance of the quartz crucible based on reception levels of the transmitted light measured by the detector; and
a light projection position changing guide that vertically moves the light source along the one wall surface of the quartz crucible; and
a light reception position changing support that vertically moves the detector along the other wall surface of the quartz crucible, wherein
the detector measures the reception levels of the light transmitted through the quartz crucible at a plurality of positions on a circle centered around an exit point of the parallel light on the other wall surface, and
the transmittance calculator calculates the transmittance of the quartz crucible at the predetermined measurement point based on a plurality of reception levels of the transmitted light measured at the plurality of positions, wherein the transmittance is a ratio of total energy of light transmitted through the quartz crucible onto the detector to total energy of light directly transmitted onto the detector without being transmitted though the quartz crucible.

13. The transmittance measurement apparatus according to claim 12 further comprising a turning support that turns a single detector along the circle.

14. The transmittance measurement apparatus according to claim 13, wherein a maximum turning angle of the detector with respect to a light axis of the parallel light is 45° or more.

15. The transmittance measurement apparatus according to claim 12 further comprising a plurality of detectors disposed at the plurality of positions.

16. The transmittance measurement apparatus according to claim 12, wherein
the light source is disposed outside the quartz crucible,
the detector is disposed inside the quartz crucible, and
the transmittance of the quartz crucible is measured in a nondestructive manner by receiving the parallel light emitted from the light source toward the quartz crucible using the detector.

17. The transmittance measurement apparatus according to claim 12 further comprising a crucible rotation support rotating the quartz crucible.

18. The transmittance measurement apparatus according to claim 12, wherein
the light source includes:
a laser light source outputting a laser beam; and
a beam expander expanding the beam diameter of the laser beam output from the laser light source.

19. The transmittance measurement apparatus according to claim 18, wherein the expanded beam diameter of the laser beam is 5 mm or more.

20. The transmittance measurement apparatus according to claim 12, wherein
the light source includes:
a laser light source outputting a laser beam; and
a line generator converting the laser beam output from the laser light source into a laser line light.

21. The transmittance measurement apparatus according to claim 20, wherein the spot length of the laser line light is 10 mm or more.

22. The transmittance measurement apparatus according to claim 12, wherein:
the light projection position changing guide further tilts and moves the light source along the one wall surface of the quartz crucible, and
the light reception position changing support further tilts and moves the detector along the other wall surface of the quartz crucible while the light projection position changing guide tilts and moves the light source.

* * * * *